(12) United States Patent
Kidoh et al.

(10) Patent No.: US 7,821,058 B2
(45) Date of Patent: Oct. 26, 2010

(54) NONVOLATILE SEMICONDUCTOR MEMORY AND METHOD FOR MANUFACTURING THE SAME

(75) Inventors: Masaru Kidoh, Kawasaki (JP); Ryota Katsumata, Yokohama (JP); Masaru Kito, Yokohama (JP); Yoshiaki Fukuzumi, Yokohama (JP); Hideaki Aochi, Kawasaki (JP); Hiroyasu Tanaka, Minato-ku (JP); Yasuyuki Matsuoka, Yokohama (JP); Yoshio Ozawa, Yokohama (JP); Mitsuru Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 11/970,992

(22) Filed: Jan. 8, 2008

(65) Prior Publication Data

US 2008/0173932 A1    Jul. 24, 2008

(30) Foreign Application Priority Data

Jan. 10, 2007   (JP) ............................. 2007-002152

(51) Int. Cl.
*H01L 27/115*   (2006.01)
*H01L 21/8247*  (2006.01)
*H01L 29/792*   (2006.01)

(52) U.S. Cl. ............... 257/324; 257/329; 257/E21.646; 257/E21.654; 257/E21.657; 257/E21.659; 257/E27.084; 257/E21.652; 257/E27.096; 257/E29.309; 257/E27.103; 257/E27.026; 257/E21.423; 257/E21.679

(58) Field of Classification Search ................. 257/275, 257/329, E21.646, E21.654, E21.657, E21.659, 257/E27.084, E21.652, E27.096; 438/212, 438/239, 242
See application file for complete search history.

(56) References Cited

U.S. PATENT DOCUMENTS

| | | | |
|---|---|---|---|
| 5,599,724 A | 2/1997 | Yoshida | |
| 5,707,885 A | 1/1998 | Lim | |
| 5,973,356 A * | 10/1999 | Noble et al. | 257/319 |
| 7,387,935 B2 * | 6/2008 | Masuoka et al. | 438/259 |
| 7,586,149 B2 * | 9/2009 | Yoon et al. | 257/329 |

FOREIGN PATENT DOCUMENTS

JP    2003-78044    3/2003

OTHER PUBLICATIONS

U.S. Appl. No. 12/575,906, filed Oct. 8, 2009, Ozawa.
Tetsuo Endoh, et al., "Novel Ultrahigh-Density Flash Memory With a Stacked-Surrounding Gate Transistor (S-SGT) Structured Cell", IEEE Transactions on Electron Devices, vol. 50, No. 4, Apr. 2003, pp. 945-951.
U.S. Appl. No. 12/396,062, filed Mar. 2, 2009, Kito et al.
U.S. Appl. No. 12/714,905, filed Mar. 1, 2010, Fukuzumi et al.

* cited by examiner

*Primary Examiner*—Matthew E Warren
*Assistant Examiner*—David Spalla
(74) *Attorney, Agent, or Firm*—Oblon, Spivak, McClelland, Maier & Neustadt, L.L.P.

(57) ABSTRACT

According to an aspect of the present invention, there is provided a nonvolatile semiconductor memory including: a columnar semiconductor; a charge storage insulating film including: a first insulating film formed around the columnar semiconductor, a charge storage film formed around the first insulating film, and a second insulating film formed around the charge storage film; an electrode extending two-dimensionally to surround the charge storage insulating film, the electrode having a groove; and a metal silicide formed on a sidewall of the groove.

15 Claims, 32 Drawing Sheets

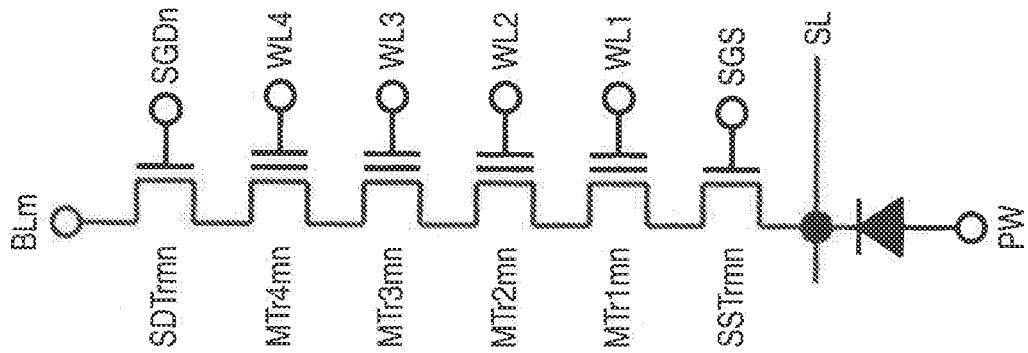
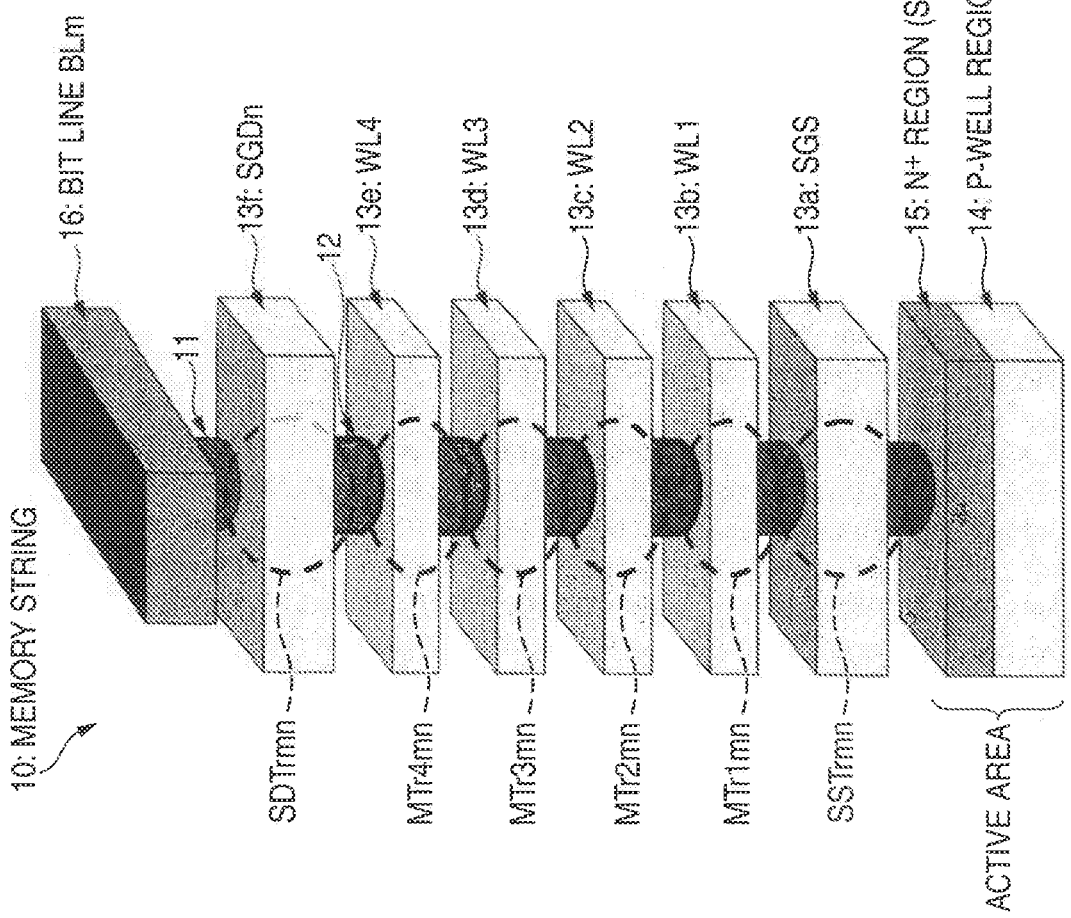

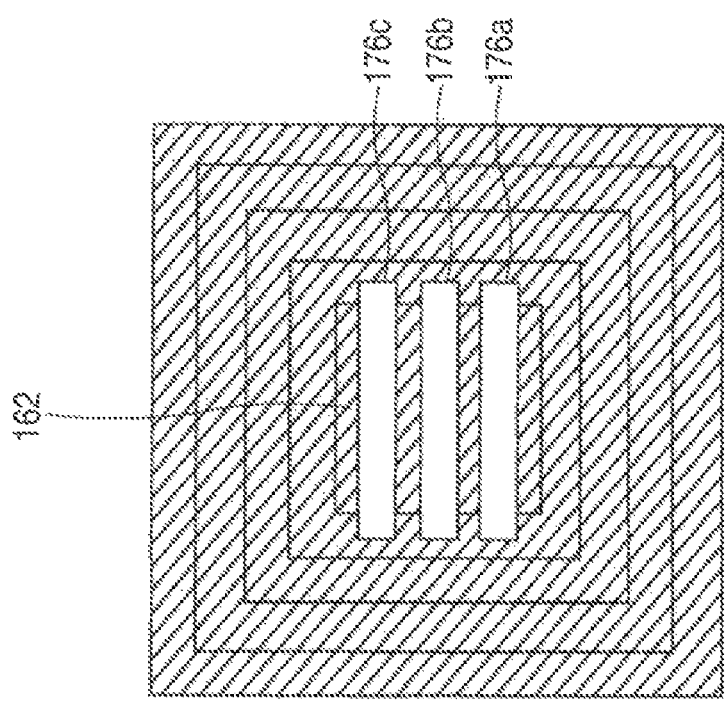
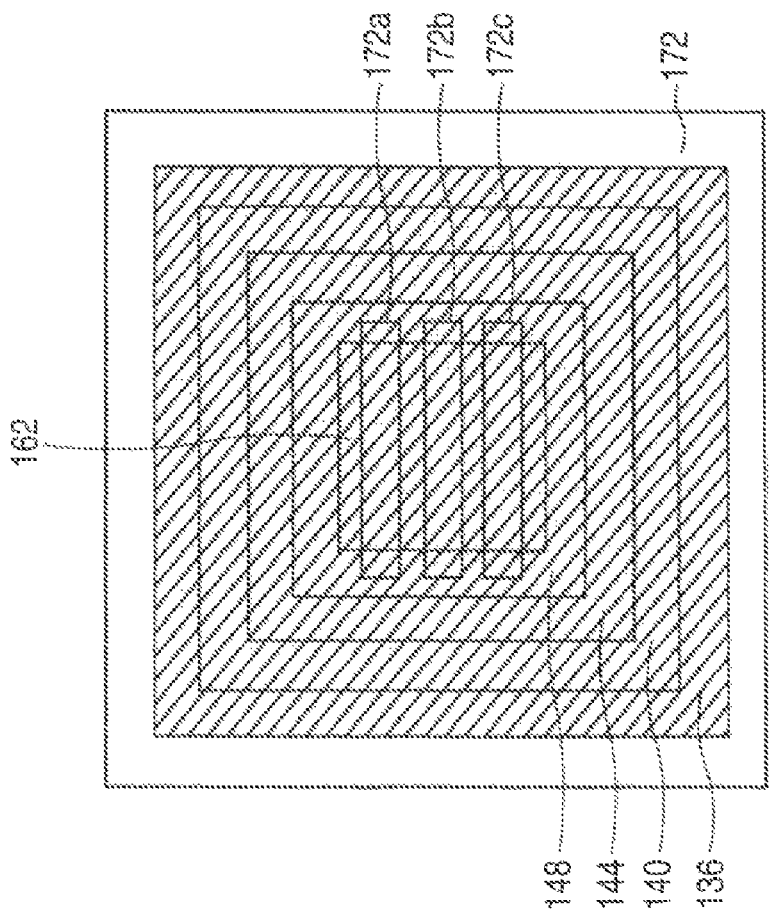
FIG. 15A
FIG. 15B

NONVOLATILE SEMICONDUCTOR MEMORY AND METHOD FOR MANUFACTURING THE SAME

CROSS-REFERENCE TO RELATED APPLICATIONS

The entire disclosure of Japanese Patent Application No. 2007-002152 filed on Jan. 10, 2007 including specification, claims, drawings and abstract is incorporated herein by reference in its entirety.

BACKGROUND OF THE INVENTION

1. Field of the Invention

An aspect of the present invention relates to an electrically rewritable semiconductor memory and in particular to a nonvolatile semiconductor memory.

2. Description of the Related Art

Demand for small-sized and large-capacity nonvolatile semiconductor memory grows sharply. Among the nonvolatile semiconductor memory, particularly, flash memory is used in various applications and a request is made for putting flash memory into a further larger capacity. Microminiaturization of the flash memory is acceleratively advancing, and thus a physical limit of the microminiaturization is being approached. With a structure where memory cells, circuit elements, etc., are placed on a flat face as in the current flash memory, enhancement of the capacity of the flash memory is realized by further microminiaturization. However, there are limits of the microminiaturization.

In recent years, to enhance the integration degree of memory, a large number of semiconductor memories each with memory cells placed three-dimensionally have been proposed. (For example, refer to JP-A-2003-078044, U.S. Pat. No. 5,599,724, U.S. Pat. No. 5,707,885 and Endo et al., "Novel Ultrahigh-Density Flash Memory With a Stacked-Surrounding Gate Transistor (S-SGT) Structured Cell", IEEE TRANSACTIONS ON ELECTRON DEVICES, VOL. 50, N04, pp 945-951, April 2003.)

In many related-art semiconductor storage devices including three-dimensionally arranged memory cells, memory cells must be subjected to a plurality of photo engraving processes (hereinafter abbreviated as "PEP," wherein patterning is performed through processes, such as a lithography process and an etching process, employing a so-called photoresist) on a per-layer basis. A PEP which is performed at a minimum line width of the design rule is taken as a "critical PEP," and a photo engraving process which is performed at a line width greater than the minimum line width of the design rule is taken as "rough PEP." In a related-art semiconductor storage device in which memory cells are arranged in a three-dimensional pattern, three critical PEPs or more are required for one layer of memory cell. Moreover, in many semiconductor storage devices, memory cells are simply stacked one on top of the other, which unavoidably results in an increase in cost attributable to three-dimensional integration of memory cells.

Additionally, in a case where the memory cells are arranged in a three-dimensional pattern, a cost reduction effect can be enhanced if all via holes for a plurality of word-line electrode layers (such as, a polysilicon layers, an amorphous silicon layers or metal layers) of the memory cells can be formed in one process.

SUMMARY OF THE INVENTION

According to an aspect of the present invention, there is provided a nonvolatile semiconductor memory including: a columnar semiconductor; a charge storage insulating film including: a first insulating film formed around the columnar semiconductor, a charge storage film formed around the first insulating film, and a second insulating film formed around the charge storage film; an electrode extending two-dimensionally to surround the charge storage insulating film, the electrode having a groove; and a metal silicide formed on a sidewall of the groove.

According to another aspect of the present invention, there is provided a nonvolatile semiconductor memory including: a plurality of columnar semiconductors that are formed in parallel and that are disposed in a matrix; a plurality of charge storage insulating films respectively formed around the plurality of columnar semiconductors; a first electrode extending two-dimensionally perpendicular to the plurality of columnar semiconductors to surround the plurality of charge storage insulating films; a plurality of gate insulating films respectively formed around the plurality of columnar semiconductors above the plurality of charge storage insulating films; a second electrode surrounds the gate insulating film perpendicular to the plurality of columnar semiconductors; and a second metal silicide formed on a sidewall of the second electrode.

According to still another aspect of the present invention, there is provided a method for manufacturing a nonvolatile semiconductor memory, the method including: forming a memory transistor region, including: forming a first insulator layer on a semiconductor substrate, forming a first conductor layer on the first insulator layer, forming a first hole in the first conductor layer and in the first insulator layer to reach the semiconductor substrate, forming a charge storage insulating film on a sidewall of the first hole, and forming a first columnar semiconductor in the first hole so as to be in contact with the charge storage insulating film; forming a selection transistor region, including: forming a second insulator layer on the first conductor layer, forming a second conductor layer on the second insulator layer, forming a second hole in the second conductor layer and in the second insulator layer above the first hole to reach the first columnar semiconductor, forming a gate insulating film on a sidewall of the second hole, and forming a second columnar semiconductor in the second hole so as to be in contact with the gate insulating film; and forming a metal silicide on at least one of a side wall of the first conductor layer and a side wall of the second conductor layer.

BRIEF DESCRIPTION OF THE DRAWINGS

Embodiments may be described in detail with reference to the accompanying drawings, in which:

FIGS. 3A and 3B are drawings to show the schematic structure of one memory string 10 of the nonvolatile semiconductor memory 1 according to the embodiment;

FIGS. 15A and 15B are top views of the nonvolatile semiconductor memory 1 according to the embodiment;

DETAILED DESCRIPTION OF THE INVENTION

Figure 1:
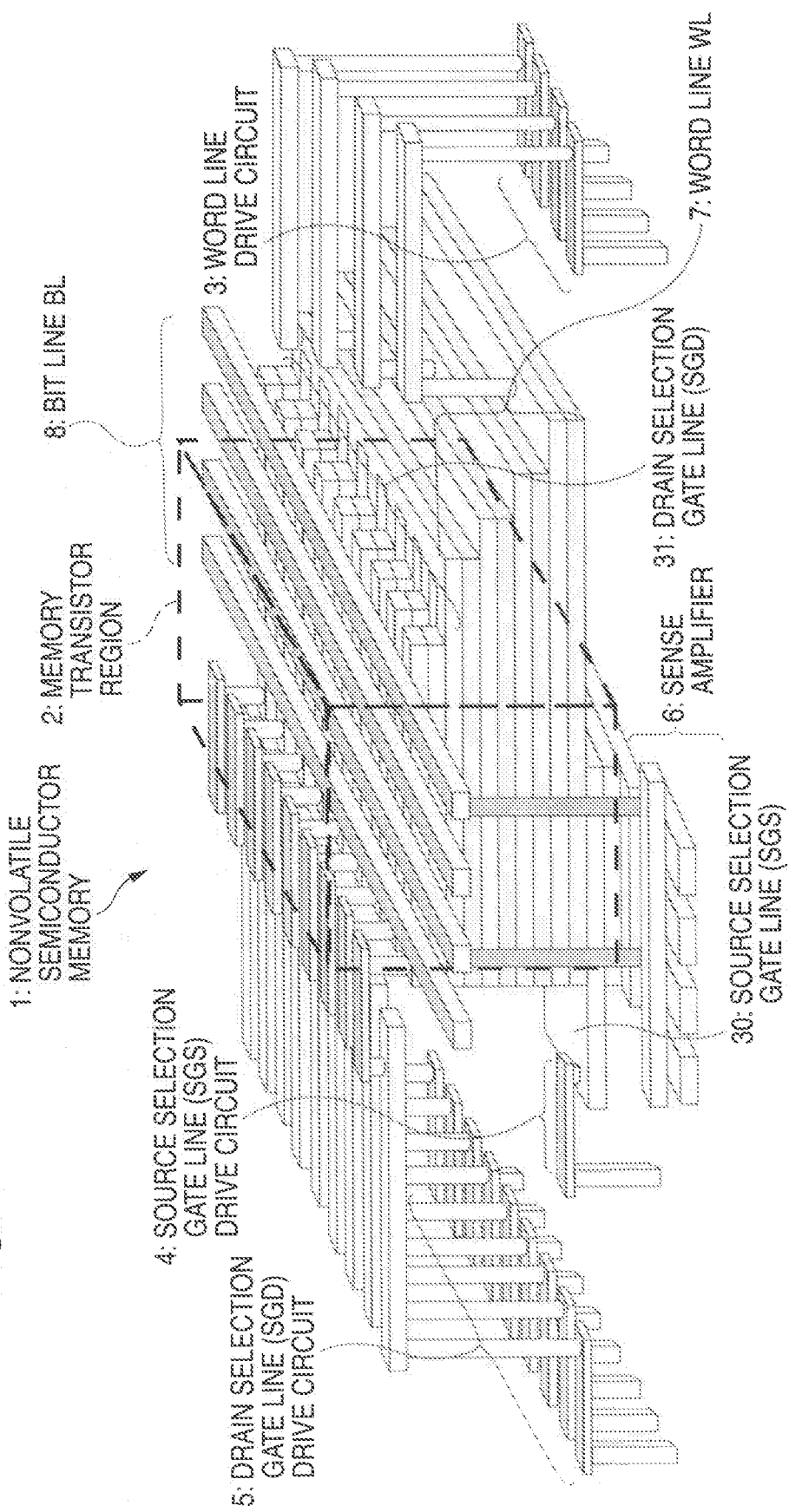
FIG. 1 is a drawing to show the schematic configuration of a nonvolatile semiconductor memory 1 according to the embodiment.

Nonvolatile semiconductor memory and its manufacturing method according to embodiments of the present invention will be discussed below, but the present invention is not limited to the following embodiments. In the embodiments, similar components are denoted by the same reference numerals and description thereof may be skipped.

First Embodiment

FIG. 1 is a drawing to show the schematic configuration of a nonvolatile semiconductor memory 1 according to a first embodiment. The nonvolatile semiconductor memory 1 according to the first embodiment has a memory transistor region 2, word line drive circuits 3, source selection gate line (SGS) drive circuits 4, drain selection gate line (SGD) drive circuits 5, sense amplifiers 6, word lines (WL) 7, bit lines (BL) 8, source selection gate lines (SGS) 30, drain selection gate lines (SGD) 31, etc. As shown in FIG. 1, in the nonvolatile semiconductor memory 1 according to the embodiment, memory transistors of the memory transistor regions 2 are formed on collectively stacked semiconductor layers. As shown in FIG. 1, each of the word lines (WL) 7 is a layer spread two-dimensionally and is formed of one conductive layer for each layer. In each layer, the word line has linear portions. The linear portions are connected at ends. In other words, the word line (WL) 7 has a shape of a comb or a planar shape formed with slits. In the nonvolatile semiconductor memory 1 according to the embodiment, sides of the linear portions forming the word line (WL) 7 of each layer are formed with metal silicide. Sides of the slits formed on the word line (WL) 7 of each layer are formed with metal silicide. Thus, the word line (WL) 7 is put into lower resistance.

In each layer, each of the linear portions forming the word line (WL) 7 may be connected with each other only on the side of the word line drive circuit. In this case, opposite ends may be connected or may not be connected. For example, if the opposite ends of the linear portions are connected, the plate-like word line spread two-dimensionally is formed with slits (shape in FIG. 28A); if the opposite ends of the linear portions are not connected, the plate-like word line spread two-dimensionally is formed like a comb (FIG. 28B). In each layer, the linear portions forming the word line (WL) 7 may not be connected. That is, the word line of each layer is formed of linear portions electrically insulated with one another. In this case, each of the linear portions may be respectively connected to the word line drive circuit.

Figure 2:
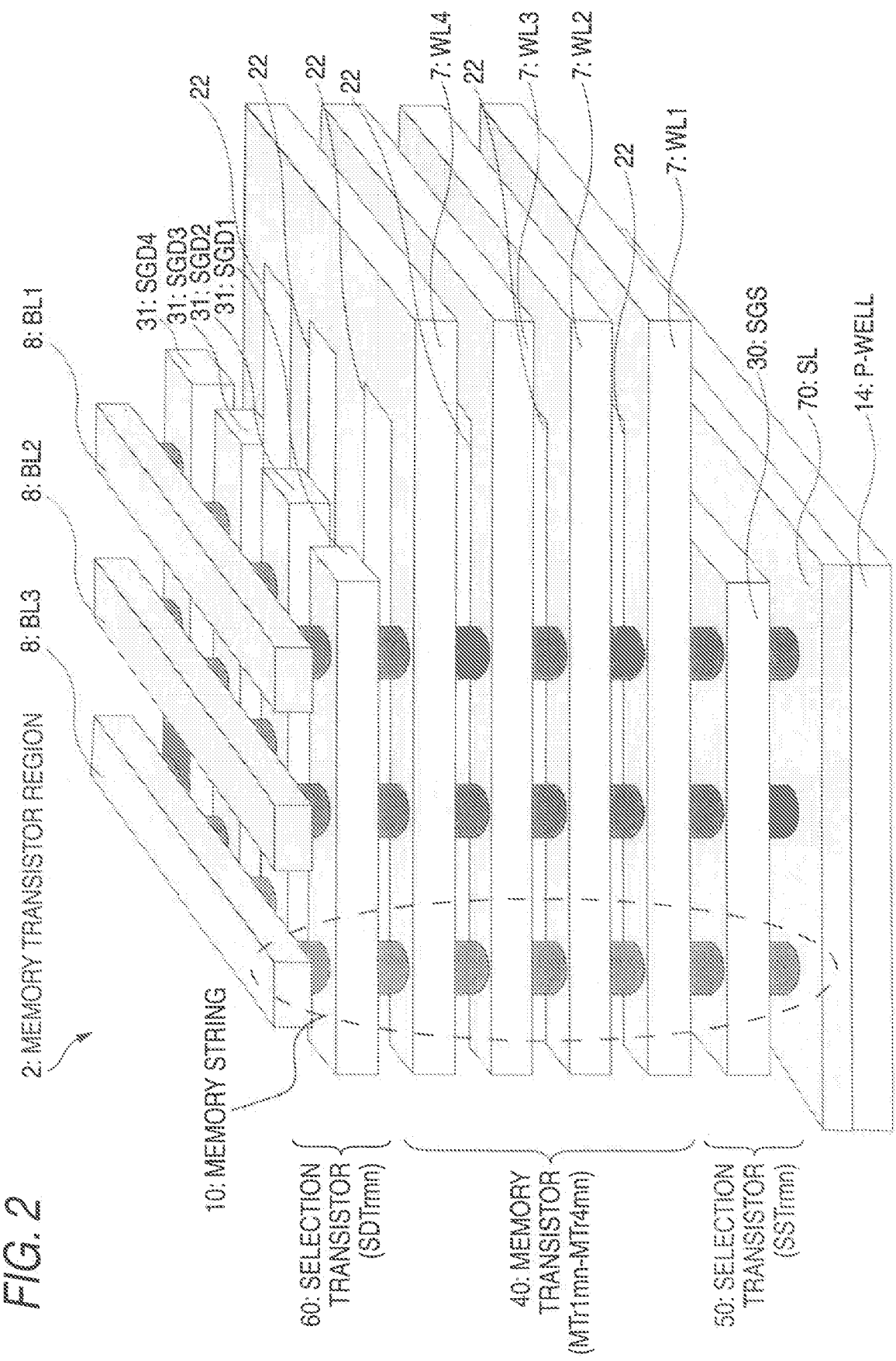
FIG. 2 is a drawing to show the schematic configuration of a part of a memory transistor region 2 of the nonvolatile semiconductor memory 1 according to the embodiment.

FIG. 2 is a drawing to show the schematic configuration of a part of the memory transistor region 2 of the nonvolatile semiconductor memory 1 according to the embodiment. In the embodiment, the memory transistor region 2 has m×n memory strings 10 (where m and n are each a natural number)

each made up of memory transistors (MTr1*mn* to MTr4*mn*) 40 and selection transistors SSTrmn 50 and SDTrmn 60. In FIG. 2, m=3 and n=4 by way of example.

The word lines WL1 to WL4 (7) are connected to gates of each of the memory transistors (MTr1*mn* to MTr4*mn*) 40 of each memory string. The word lines WL1 to WL4 (7) are each formed of the same conductive layer. In the nonvolatile semiconductor memory 1 according to the embodiment, the word lines WL1 to WL4 (7) are spread two dimensionally as described above. Also, the word lines WL1 to WL4 (7) are spread two dimensionally in a roughly perpendicular direction to the memory string 10. The source selection gate lines (SGS) 30 for driving the source selection transistors SSTrmn 50 can always be set to common voltage on operation. Therefore, in the embodiment, the source selection gate lines (SGS) 30 adopt a structure shaped like a flat plate. However, the source selection gate lines (SGS) 30 may have a wiring structure where they are separated and insulated. The drain selection gate lines (SGD) 31 may also be of a structure shaped like a flat plate or a wiring structure where they are separated and insulated. As also shown in FIG. 2, the sides of the slits formed in the word lines (WL) 7 of each layer are formed with metal silicide 22. In then on volatile semiconductor memory 1 according to the embodiment, a slit is formed for each memory string column and the sides of each slit are formed with metal silicide 22. Instead of forming a slit for each memory string column, a slit may be provided every several memory string columns and the sides of each slit may be formed with metal silicide 22.

Each memory string 10 has a columnar semiconductor on an n+ region 15 formed in a P-well region 14 of a semiconductor substrate. The memory strings 10 are placed like a matrix in a plane perpendicular to the columnar semiconductor. The columnar semiconductor may be shaped like a cylinder or may be shaped like a prism. The columnar semiconductors include those not only having a symmetrical structure with respect to the same center line, but also having a step-by-step structure such that a columnar semiconductor having a different center line is stacked on a columnar semiconductor having a symmetrical shape with respect to the center line.

FIG. 3A shows the schematic structure of one memory string 10 (here, the mn-th memory string) of the nonvolatile semiconductor memory 1 according to the embodiment and FIG. 3B is an equivalent circuit diagram. The memory string 10 has the four memory transistors MTr1*mn* 40 to MTr4*mn* 40 and the two selection transistors SSTrmn 50 and SDTrmn 60 connected in series. In one memory string 10, a columnar semiconductor 11 is formed in an N+ region 15 formed in a P-type region (P-Well region) on a semiconductor substrate, an insulating film 12 is formed in the surroundings, and further electrodes 13a to 13f of a flat shape (flat plate shape) formed like a column or formed with slits in the surroundings. The electrodes 13a to 13f, the insulating films 12, and the columnar semiconductors 11 form the memory transistors MTr1*mn* 40 to MTr4*mn* 40, the selection transistor SSTrmn 50, and the selection transistor SDTrmn 60. The insulating films 12 of the selection transistor SSTrmn 50 and the selection transistor SDTrmn 60 are silicon oxide film, for example. The insulating films 12 of the memory transistors MTr1*mn* 40 to MTr4*mn* 40 include a charge storage layer and are, for example, made by stacking a silicon oxide film, a silicon nitride film and a silicon oxide film. The electrodes 13b to 13e become word lines WL1 to WL4 (7), the electrode 13f becomes the drain selection gate line SGDn, and the electrode 3a becomes the source selection gate line SGS. The bit line BLm 8 is connected to one end of source/drain of the selection transistor SDTrmn 60, and a source line SL (in the embodiment, the N+ region 15) 70 is connected to one end of source/drain of the selection transistor SSTrmn 50. In the embodiment, four memory transistors MTr are connected to one memory string 10 in series by way of example, but the embodiment is not limited to the mode. The number of the memory transistors MTr making up one memory string 10 may be determined by taking into account the capacity.

Figure 4:
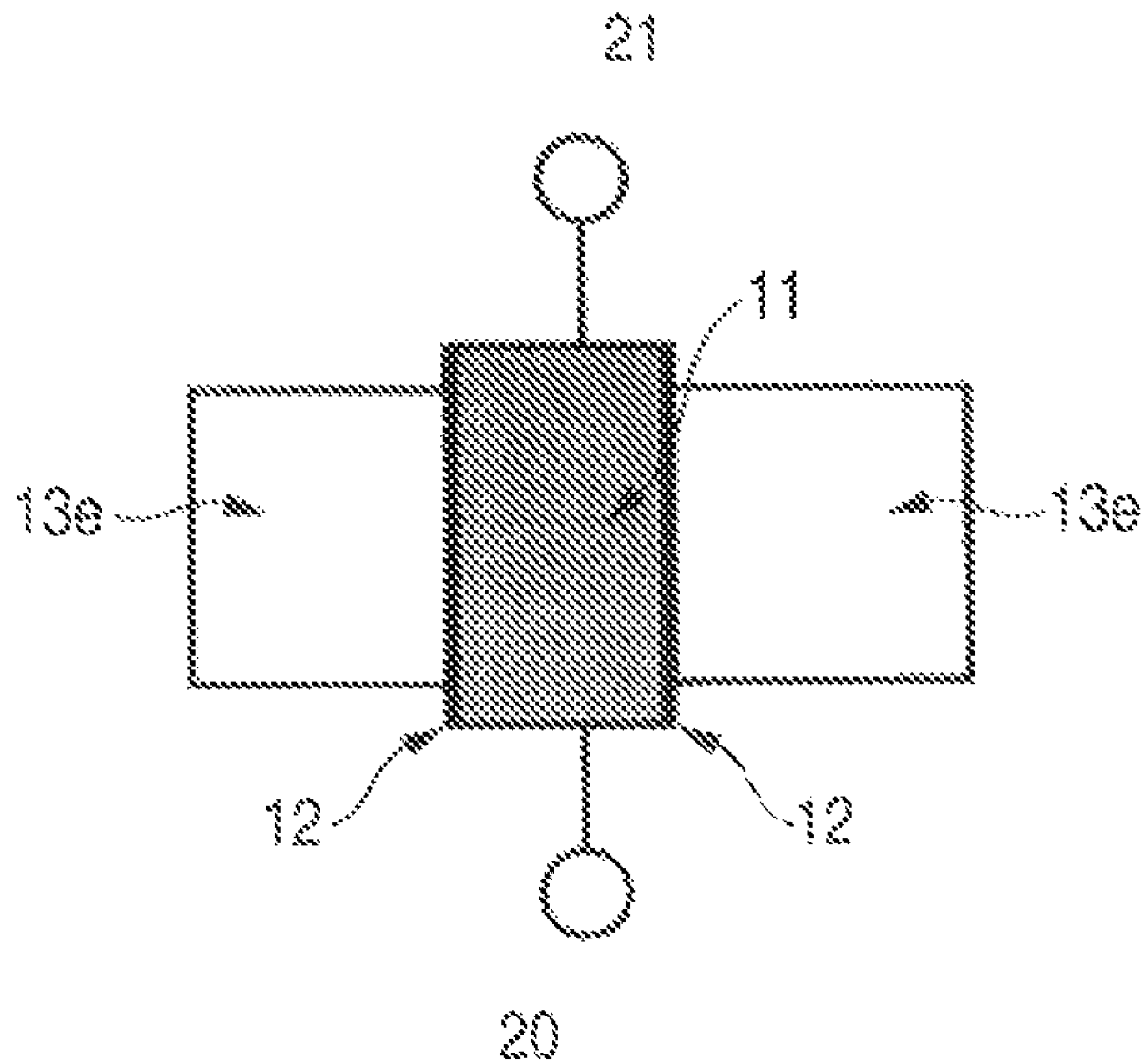
FIG. 4 is a drawing to show the sectional structure of one memory transistor MTr of the nonvolatile semiconductor memory 1 according to the embodiment.

FIG. 4 is a drawing to show the sectional structure of one memory transistor MTr (for example, MTr4*mn*) in the embodiment. Other memory transistors MTr1*mn* to MTr3*mn* have each a similar structure to that of the memory transistor MTr4*mn*. For the memory transistor MTr4*mn*, a conductive layer 13e surrounding the columnar semiconductors 11 through the insulator 12 functions as a control gate electrode. A source 20 and a drain 21 of the memory transistor MTr4*mn* are formed in the columnar semiconductors 11. However, if the memory transistor MTr1*mn* and the selection gate transistors SSTrmn and SDTrmn have a depletion-type transistor structure, the semiconductors 11 portion is not provided with a distinct source/drain diffusion region in some cases. An enhancement-type transistor wherein of the columnar semiconductors 11, a region substantially surrounded by the conductive layer 13e is a P-type semiconductor and a region substantially unsurrounded by the conductive layer 13e is an N-type semiconductor may be adopted.

While one memory string 10 has been described with FIGS. 3A, 3B and 4, all memory strings have a similar structure in the nonvolatile semiconductor memory 1 according to the embodiment.

The operation of the nonvolatile semiconductor memory 1 according to the embodiment (read operation, write operation, erasing operation) will be described. In the embodiment, memory transistor MTr may be called "bit".

(Read Operation)

Figure 5:
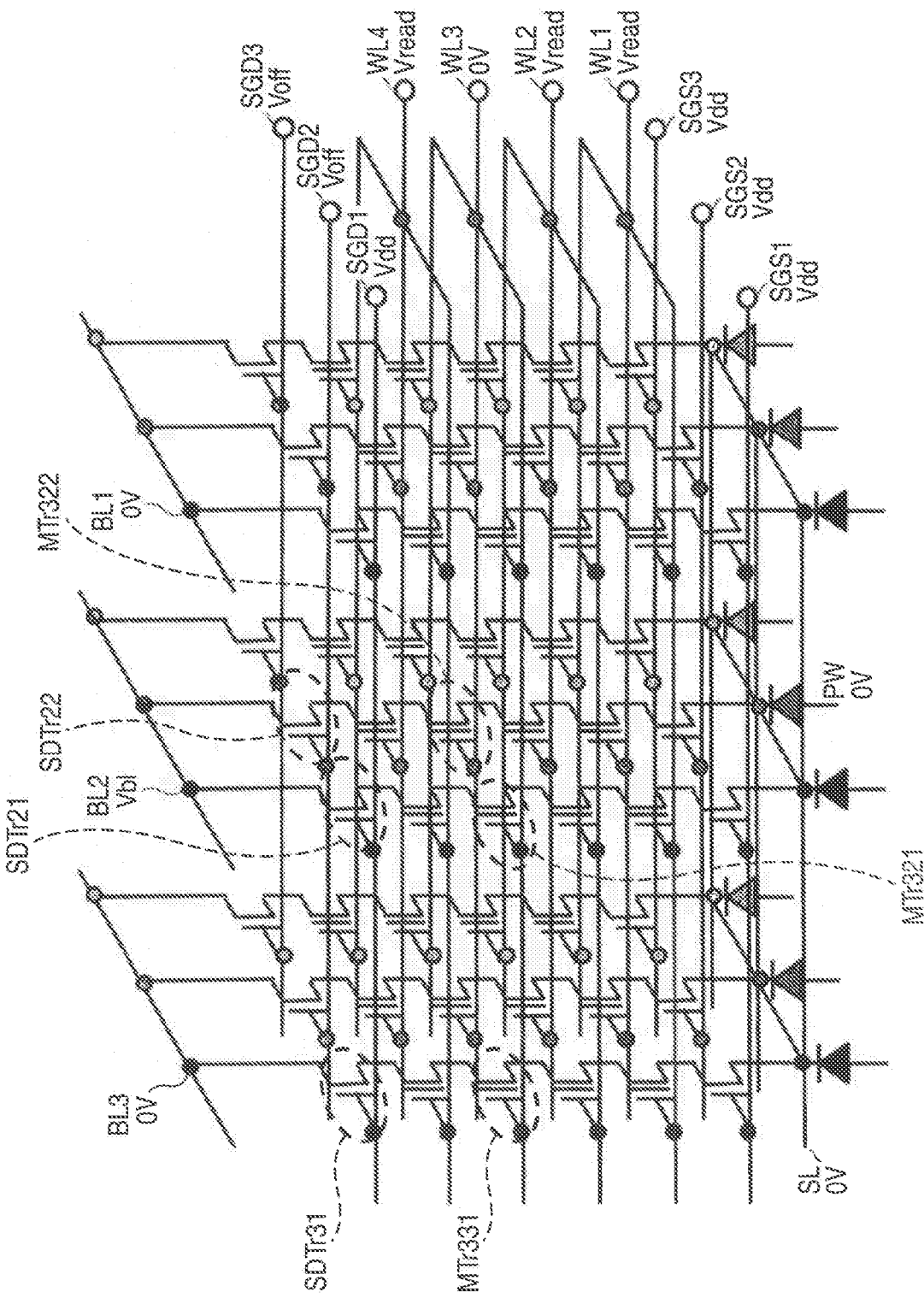
FIG. 5 is a drawing to show a bias state when data read operation of a memory transistor MTr indicated by the dotted line is performed in the nonvolatile semiconductor memory 1 according to the embodiment.

FIG. 5 is a drawing to show a bias state when data read operation of a memory transistor MTr321 (40) indicated by the dotted line is performed in the nonvolatile semiconductor memory 1 according to the embodiment. In the description, it is assumed that the memory transistor MTr in the embodiment is a MONOS-type vertical transistor and that a threshold voltage Vth of the memory transistor MTr in a state in which no electrons are stored in the charge storage layer (neutral threshold voltage) is in the vicinity of 0 V.

When data is read from the memory transistor MTr321 (40), Vb1 (for example, 0.7 V) is applied to the bit line BL 2 (8), 0 V to other bit lines BL 8, 0 V to the source line SL 70, Vdd (for example, 3.0 V) to the selection gate lines SGD1 (31) and SGS1 (30), Voff (for example, 0 V) to other selection gate lines SGD 31 and SGS 30, and Vpw (for example, 0 V. However, Vpw may be any voltage unless the P-well region 14 and the memory string 10 are forward bias) to the P-well region 14. The word line WL3 (7) is set to 0 V and other word lines WL 7 are set to Vread (for example, 4.5 V) and current of the bit line BL2 (8) is sensed, whereby it is made possible to read data information of the bit (MTr321).

In the nonvolatile semiconductor memory 1 according to the embodiment, if the word lines WL1 to WL4 (7) are driven at common voltage and the selection gate lines SGS1 (30) to SGS3 (30) are driven at common voltage, it is made possible to read the data of the threshold voltage of any desired bit.

(Write Operation)

Figure 6:
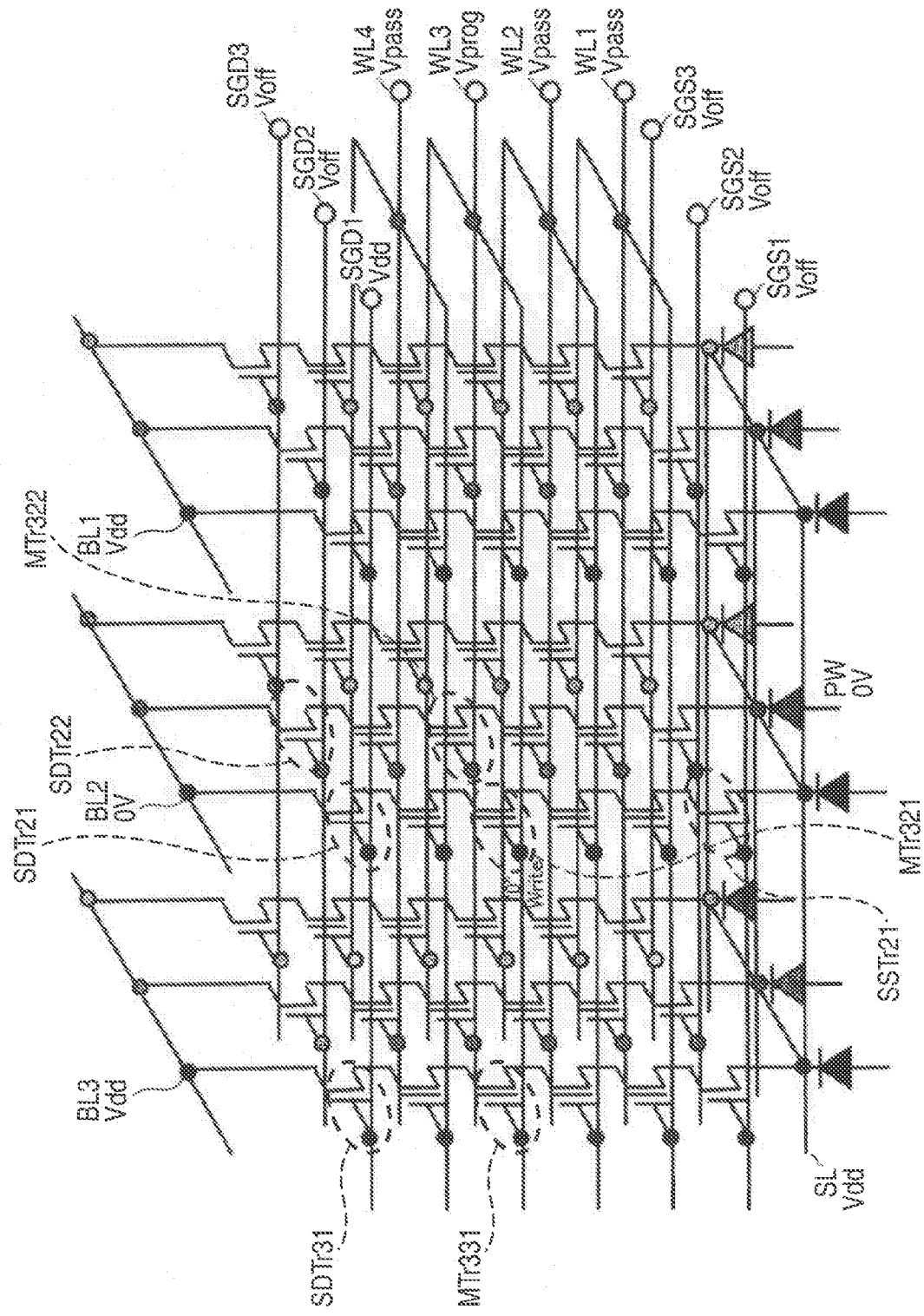
FIG. 6 is a drawing to show a bias state when data write operation of the memory transistor MTr indicated by the dotted line is performed in the nonvolatile semiconductor memory 1 according to the embodiment.

FIG. 6 is a drawing to show a bias state when data write operation of the memory transistor MTr321 (40) indicated by the dotted line is performed in the nonvolatile semiconductor memory 1 according to the embodiment.

To write data "0" into the memory transistor MTr321 (40), 0 V is applied to the bit line BL 2 (8), Vdd to other bit lines BL 8, Vdd to the source line SL 70, Vdd to the selection gate line SGD1, Voff to other selection gate lines SGD 31, Voff to the selection gate lines SGS1 (30) to SGS3 (30), and Vpw (for example, 0 V) to the P-well region 14. The word line WL3 (7) is set to Vprog (for example, 18 V) and other word lines WL 7 are set to Vpass (for example, 10 V). Accordingly, electrons are poured into the charge storage layer and the threshold voltage of the memory transistor MTr321 (40) shifts in a positive direction.

To write data "1" into the memory transistor MTr321 (40), namely, to pour no electrons into the charge storage layer, Vdd is applied to the bit line BL 2 (8), whereby the selection transistor SDTr21 (60) is turned off and no electrons are poured into the charge storage layer of the memory transistor MTr321 (40).

The voltage of each bit line BL 8 is set to 0 V or Vdd appropriately, whereby it is made possible to perform page write.

(Erasing Operation)

Figure 7:
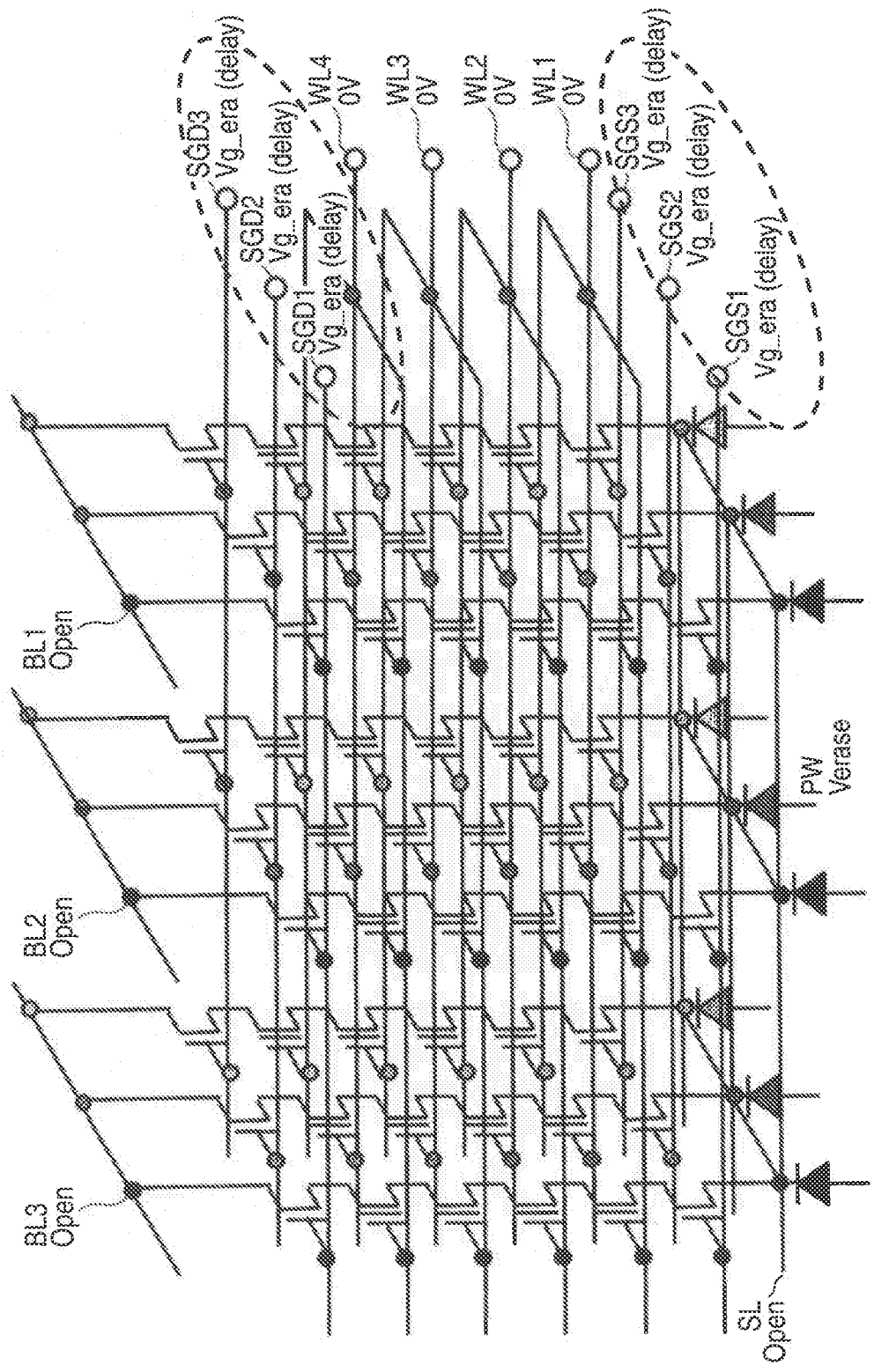
FIG. 7 is a drawing to show a bias state of a selected block when data erasing operation of the memory transistors MTr in the selected block is performed in the nonvolatile semiconductor memory 1 according to the embodiment.
Figure 8:
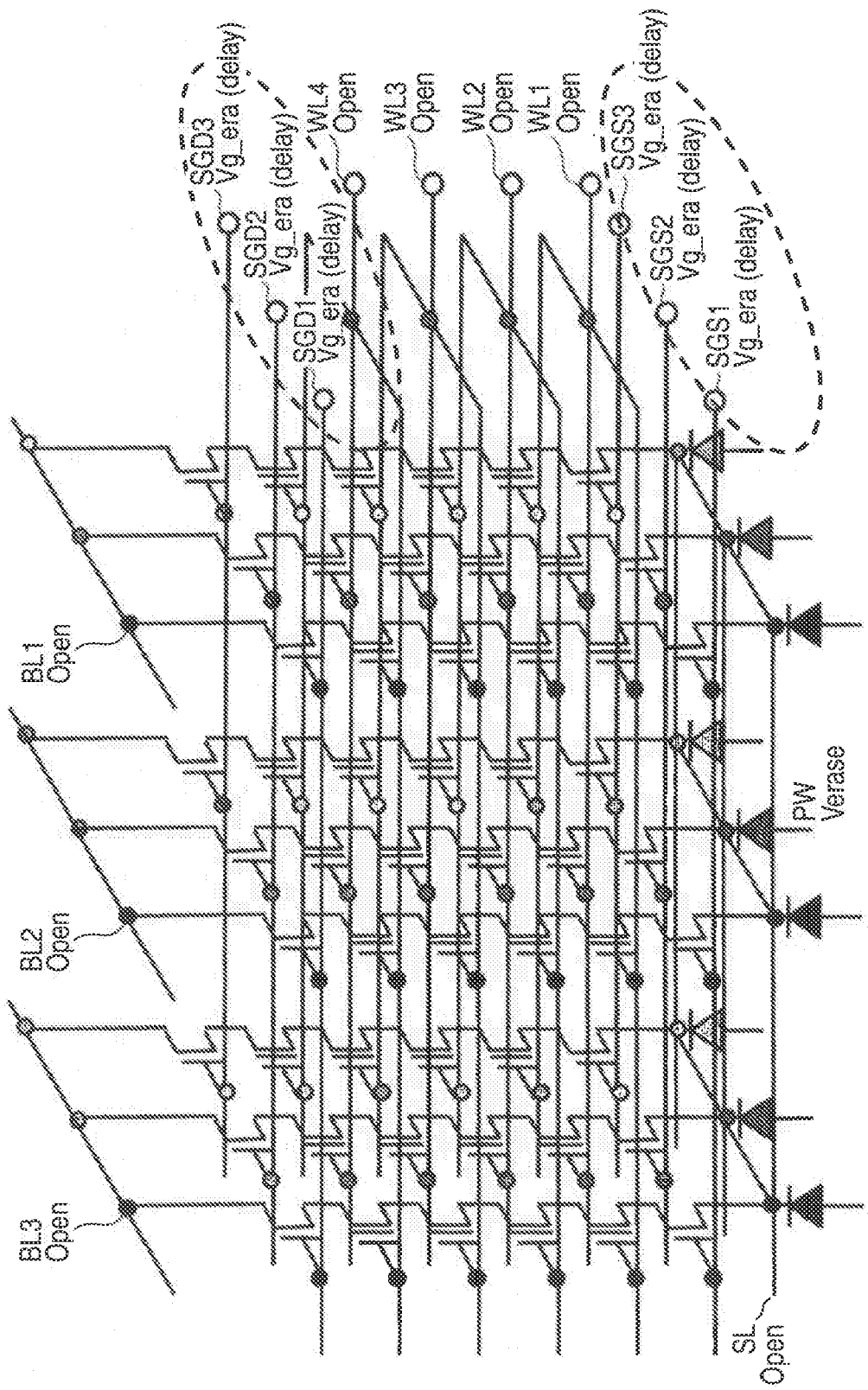
FIG. 8 is a drawing to show a bias state of an unselected block when data erasing operation of the memory transistors MTr in the selected block is performed in the nonvolatile semiconductor memory 1 according to the embodiment.

Data is erased in block units each made up of memory strings. FIG. 7 is a drawing to show a bias state of a selected block when data erasing operation of the memory transistors MTr in the selected block is performed in the nonvolatile semiconductor memory 1 according to the embodiment. FIG. 8 is a drawing to show a bias state of an unselected block when erasing operation is performed in the nonvolatile semiconductor memory 1 according to the embodiment.

In FIG. 7, in the selected block (block to be erased), Verase (for example, 20 V) is applied to the P-well region 14, the source line SL 70 is floated, and the voltage of the selection gate lines SGS 30 and SGD 31 is raised (for example, 15 V) by slightly shifting a time from the timing at which Verase is applied to the P-well region 14 (for example, shifting about 4 μsec). Accordingly, a voltage close to Verase propagates to the channel formation region (body part) of the memory transistor MTr and thus if the word lines WL1 to WL4 (7) are set to 0 V, for example, the electrons in the charge storage layer of the memory transistor MTr are pulled out into P-well and the data can be erased.

In FIG. 8, in the unselected block, since the word lines WL1 to WL4 (7) are floated, the voltages of the word lines WL1 to WL4 (7) are raised through the capacitive coupling with the channel formation region of the memory transistor MTr. Therefore, a potential difference on the charge storage layers of the memory transistors MTr1 to MTr4 does not occur and thus electrons are not pulled out (erased) from the charge storage layers.

Table 1 lists the applied voltages among the read operation, the write operation, and the erasing operation of the nonvolatile semiconductor memory 1 according to the embodiment.

TABLE 1

|     | Read  | Write"0" | Write"1" | Erase (Selected) | Erase (Unselected) |
| --- | ----- | -------- | -------- | ---------------- | ------------------ |
| BL  | Vbl   | 0        | Vdd      | Verase           | Verase             |
| SGD | Vdd   | Vdd      | Vdd      | Vera del         | Vera del           |
| WL4 | Vread | Vpass    | Vpass    | 0                | open               |
| WL3 | 0     | Vprog    | Vprog    | 0                | open               |
| WL2 | Vread | Vpass    | Vpass    | 0                | open               |
| WL1 | Vread | Vpass    | Vpass    | 0                | open               |
| SGS | Vdd   | Voff     | Voff     | Vera del         | Vera del           |
| SL  | 0     | Vdd      | Vdd      | open             | open               |
| PW  | 0     | 0        | 0        | Verase           | Verase             |

(Manufacturing Method)

In a manufacturing process of the nonvolatile semiconductor memory according to the embodiment, a lower selection gate (SGS) layer is formed and then memory cell layers are deposited in order, holes to form channel parts of memory cell transistors are formed collectively in a photo etching step, and amorphous silicon (a-Si) or polysilicon (Poly-Si), etc., is deposited in the holes to form channels. Then, a selection gate transistor layer is formed. When gate electrodes of upper selection gates are patterned, a layer forming the word lines of each memory cell layer is patterned at the same time. Then, sides of linear portions of the word lines and the upper selection gates (sides of slit portions) are formed with metal silicide. Then, gate insulating films and channels of the upper selection gates are formed and further via holes for connecting the word lines and a word line drive circuit are formed. In the nonvolatile semiconductor memory with the memory cell layers deposited three-dimensionally, memory cell regions are formed as the memory cell layers each with memory cells formed in an amorphous silicon film (or polysilicon film) which will become word line electrodes having a two-dimensional flat-plate structure portion are deposited three-dimensionally (namely, stereoscopically) and thus via holes are formed stereoscopically about connection of the word line drive circuit, etc., to each amorphous silicon film which will become word line electrodes.

Figure 9:
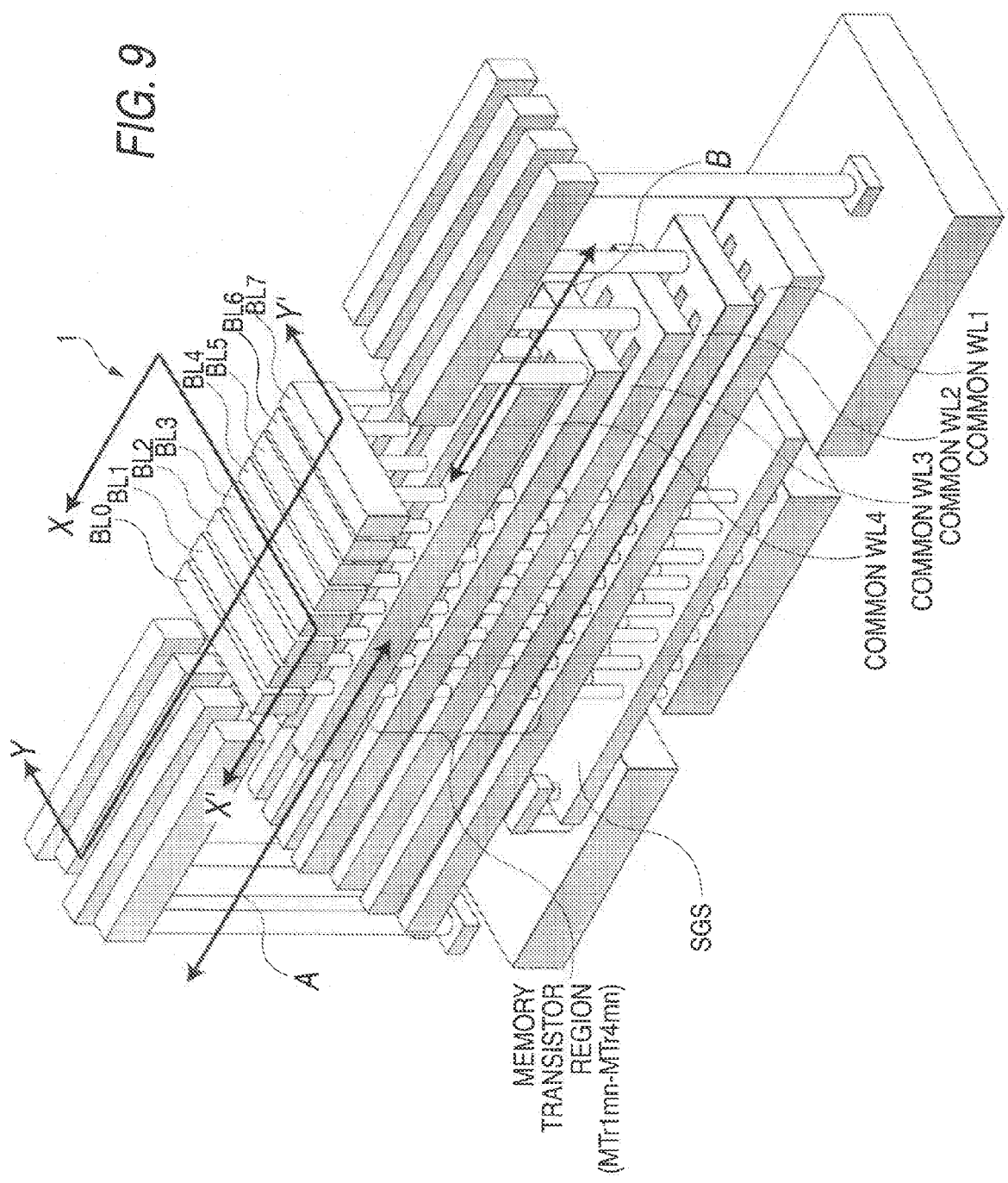
FIG. 9 is a bird's-eye view of the nonvolatile semiconductor memory 1 according to the embodiment.

FIG. 9 is a birds-eye view of the nonvolatile semiconductor memory 1 according to the embodiment. The nonvolatile semiconductor memory 1 according to the embodiment has a structure wherein the memory transistors are stacked on the semiconductor substrate. As shown in FIGS. 1 and 9, each of the word lines WL1 to WL4 (7) is spread two-dimensionally in the region where the memory cells are formed (memory transistor region 2) and is formed of the same conductive layer for each layer. In each layer, the word line has linear portions. The linear portions are connected at ends. The word line (WL) 7 has a shape of a comb or a planar shape formed with slits. In the nonvolatile semiconductor memory 1 according to the embodiment, sides of the linear portions forming the word line (WL) 7 of each layer are formed with metal silicide. This means that sides of the slits formed in the word line (WL) 7 of each layer are formed with metal silicide. Thus, the word line (WL) 7 is put into lower resistance. Using the via holes formed at the same time according to the photo engraving process, the bit lines (BL) 8 are connected to the sense amplifier 6 and the selection gate lines (SGD) 31 are connected to the selection gate line SGD drive circuit 5.

Since each of the word lines WL1 to WL4 (7) is formed of a common conductive layer (memory cell layer) where the memory cells are formed two-dimensionally (namely, like a flat plane) as described above, the number of the word line drive circuits 3 can be drastically decreased and the chip area can be reduced.

The manufacturing process of the nonvolatile semiconductor memory 1 according to the embodiment will be discussed with FIGS. 10 to 19. In FIGS. 10 to 19, a peripheral circuit region where the peripheral circuits of the word line drive circuit, the sense amplifier 6, etc., are formed is shown at the left and the memory transistor region is shown at the right. FIGS. 10 to 19 show the portion corresponding to region A of the cross section taken on line Y-Y' and the cross section taken on line X-X' of the nonvolatile semiconductor memory 1 according to the embodiment shown in FIG. 9. In the region A of the cross section taken on line Y-Y' and the cross section taken on line X-X' of the nonvolatile semiconductor memory 1 according to the embodiment shown in FIG. 9, three memory strings are shown in the Y-Y' cross section direction and two memory strings are shown in the X-X' cross section direction.

Figure 10:
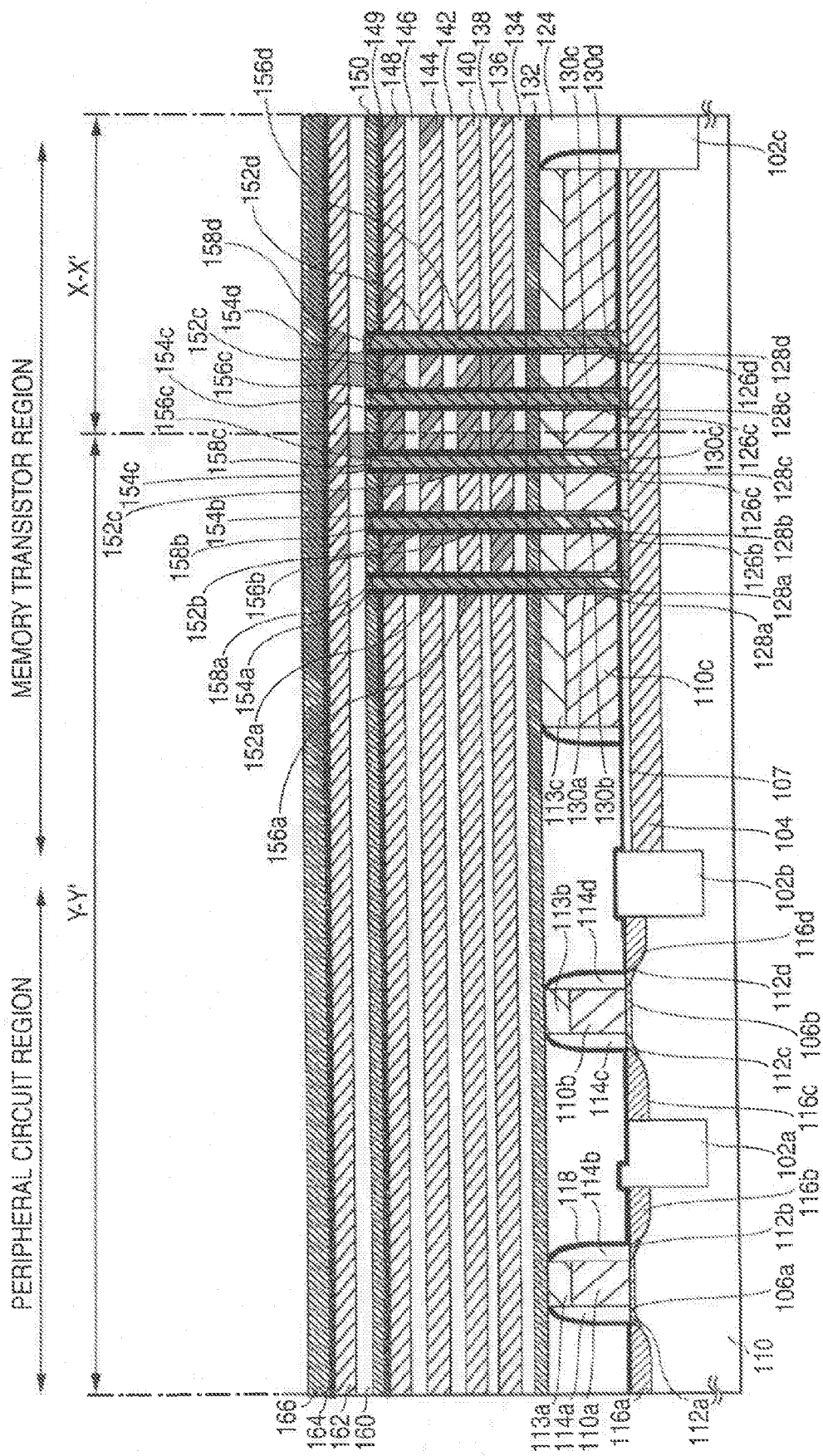
FIG. 10 is a drawing to show a manufacturing process of the nonvolatile semiconductor memory 1 according to the embodiment.

A manufacturing process of peripheral circuit transistors and lower part selection transistors will be discussed based on FIG. 10. Element isolation regions (STI) 102a, 102b, and 102c are formed on a semiconductor substrate 100. Next, boron (B) ions are implanted to form a P-well region 104 and further boron (B) ions are implanted into the vicinity of the surface of the semiconductor substrate 100 to form channel implant regions 106a and 106b for adjusting the threshold voltage Vth of the transistor. Here, the transistors of the peripheral circuit region are N channel type transistors by way of example; ions for giving N type are implanted into any desired region, thereby forming an N-well region and forming P channel type transistors (not shown). Next, impurity ions of phosphorus (P), etc., are implanted only into the memory transistor region to form an n+ diffusion region 107 which will become a source line SL. Next, a silicon nitride film and a silicon oxide film are deposited, a photoresist is formed to any desired pattern, and wet etching is performed, whereby a silicon nitride film and a silicon oxide film are formed only in the memory transistor region. Next, a thick gate insulating film of high voltage transistors is formed, and a pattern is formed using a photoresist and wet etching is performed so as to open other regions than the memory transistor region or high voltage transistor region, thereby forming a thick gate insulating film. A thin gate insulating film for high-speed operation transistors is formed in the wet-etched region. Next, a polysilicon (poly-Si) film and a silicon nitride film to which conductive impurities of phosphorus (P), etc., are added are deposited and etching is performed to form gate electrodes 110a and 110b and cap silicon nitride films 113a and 113b of the transistors in the peripheral circuit region and a gate electrode 110c and a cap silicon nitride film 113c of selection transistors in a memory cell region. Next, P ions, As ions, etc., are implanted into an N channel type transistor region in the peripheral circuit region to form N type regions 112a, 112b, 112c, and 112d. Next, the silicon nitride film deposited on the full face of the substrate is anisotropically etched to form side walls 114a, 114b, 114c, and 114d. Next, arsenic (As) ions are implanted into the N channel type transistor region in the peripheral circuit region to form source/drain regions 116a, 116b, 116c, and 116d. Next, B ions are implanted into a P channel type transistor region in the peripheral circuit region to form a source/drain region (not shown). Next, a silicon nitride film (barrier silicon nitride film) 118 is formed on the full face of the substrate. Next, an interlayer insulating film (BPSG film) 124 is formed on the full face of the substrate and planarization is performed by CMP, etc.

Next, a photoresist layer (not shown) is formed and holes 126a to 126d are formed to form selection transistors like a matrix in the memory cell region. As many holes 126a to 126d as the number of the memory strings in a memory element region are formed. Next, P ions, etc., are implanted only into the memory transistor region and then a silicon oxide film and an amorphous silicon film are formed only on the side walls and bottoms of the holes by an LPCVD method, etc. Next, the silicon oxide film and the amorphous silicon film on the bottoms of the holes are etched by RIE to form amorphous silicon films 128a to 128d. Next, after the amorphous silicon films are formed, planarization is performed by CMP, etc., to form amorphous silicon films 130a to 130d. Next, P ions, etc., are implanted only into the channel regions of the memory transistors. Next, As ions, etc., are implanted only into the memory transistor region to form a drain diffusion layer and then the As ions are activated by RTA (Rapid Thermal Annealing). The peripheral circuit transistors and the lower part selection transistors are now complete. P ions, etc., are implanted into the channel part, but no ions may be implanted.

Next, a silicon oxide film 132 is formed on the full face of the substrate. Next, a silicon oxide film 134, an amorphous silicon film 136, a silicon oxide film 138, an amorphous silicon film 140, a silicon oxide film 142, an amorphous silicon film 144, a silicon oxide film 146, an amorphous silicon film 148, a silicon oxide film 149, and a silicon nitride film 150 are formed in order. Next, holes 152a to 152d to form columnar portions of memory cells (which will be hereinafter referred to as "memory plug holes") are formed so as to match the holes 126a to 126d in the memory transistor region. As many memory plug holes as the number of the memory strings in the memory transistor region are formed.

Next, a silicon oxide film, a silicon nitride film, a silicon oxide film, and an amorphous silicon film are formed in order. Next, the amorphous silicon film is etched by RIE to form a spacer. In FIG. 10, the silicon oxide film, the silicon nitride film, the silicon oxide film, and the amorphous silicon film are shown as 154a to 154d collectively. The silicon oxide film (first insulating film), the silicon nitride film, and the silicon oxide film (second insulating film) form an ONO film. The silicon nitride film is functioning as a charge storage layer of the memory transistors. An insulating film of an alumina film, etc., may be used in place of the silicon oxide film.

Next, using the spacer of the amorphous silicon film formed in the memory plug holes 152a to 152d, the silicon oxide film, the silicon nitride film, and the silicon oxide film are etched to expose parts of the amorphous silicon films 130a to 130d formed in the holes 126a to 126d. Next, amorphous silicon films 156a to 156d are formed so as to fill in the memory plug holes 152a to 152d and then planarization is performed by CMP, etc. Next, As ions are implanted and RTA is performed, thereby forming drain diffusion layers 158a to 158d.

Figure 11:
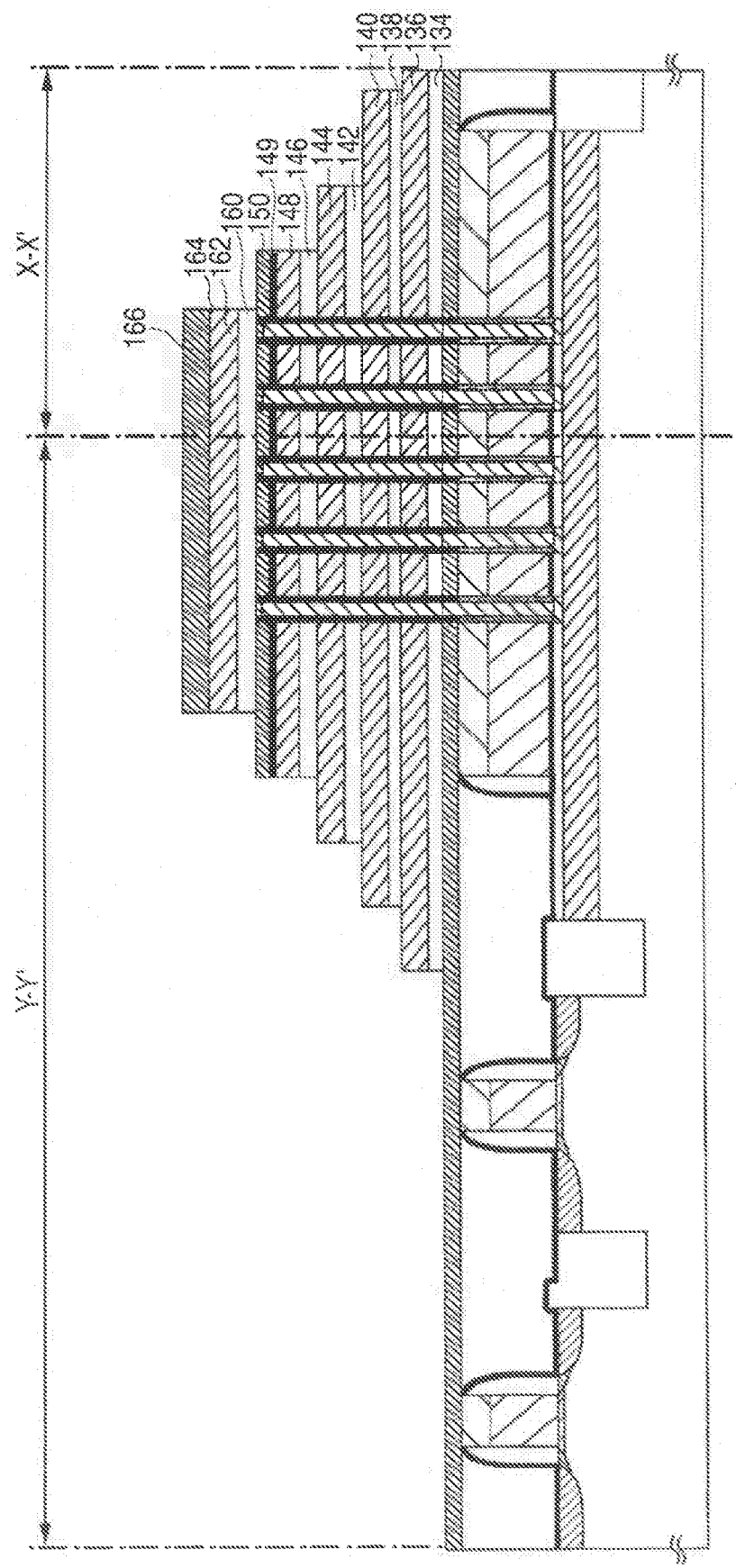
FIG. 11 is a drawing to show the manufacturing process of the nonvolatile semiconductor memory 1 according to the embodiment.
Figure 12:
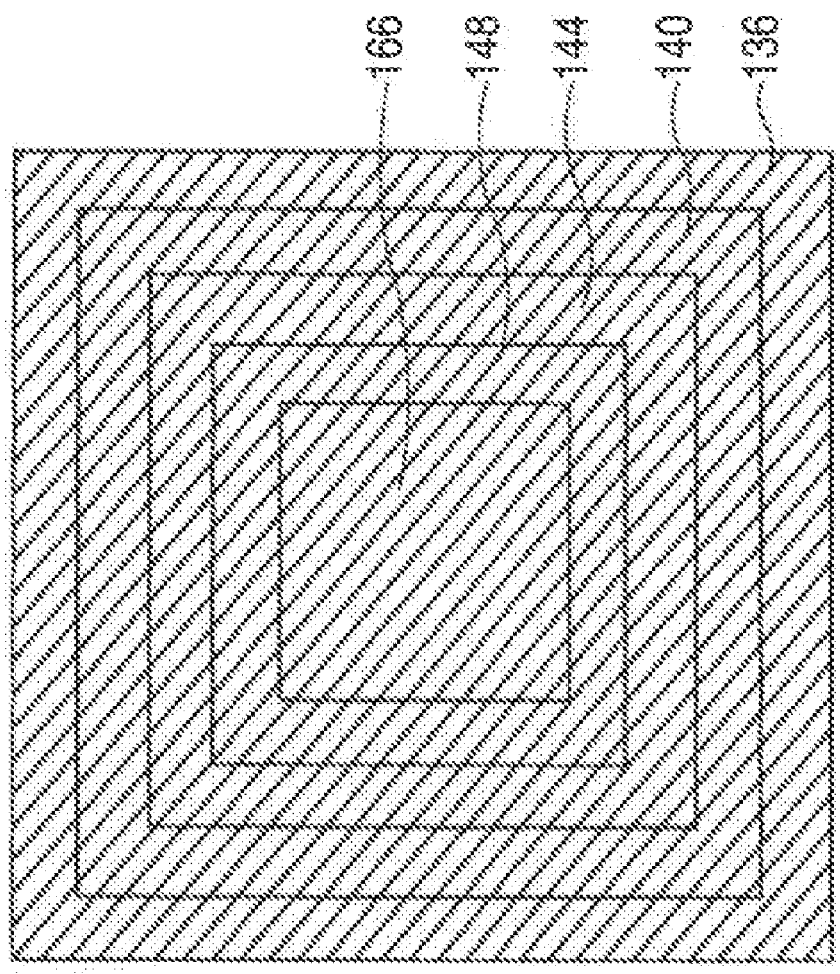
FIG. 12 is a top view of the nonvolatile semiconductor memory 1 according to the embodiment.

Next, a silicon oxide film 160, an amorphous silicon film 162, a silicon oxide film 164, and a silicon nitride film 166 are formed in order. Next, a resist is formed in the memory transistor region and etching is performed and then the resist is slimmed and further etching is performed. This process is repeated, thereby treating the silicon oxide film 134, the amorphous silicon film 136, the silicon oxide film 138, the amorphous silicon film 140, the silicon oxide film 142, the amorphous silicon film 144, the silicon oxide film 146, the amorphous silicon film 148, the silicon oxide film 149, the silicon nitride film 150, the silicon oxide film 160, the amorphous silicon film 162, the silicon oxide film 164, and the silicon nitride film 166 stepwise as shown in FIG. 11. FIG. 12 is a top view of the memory transistor region portion.

Figure 13:
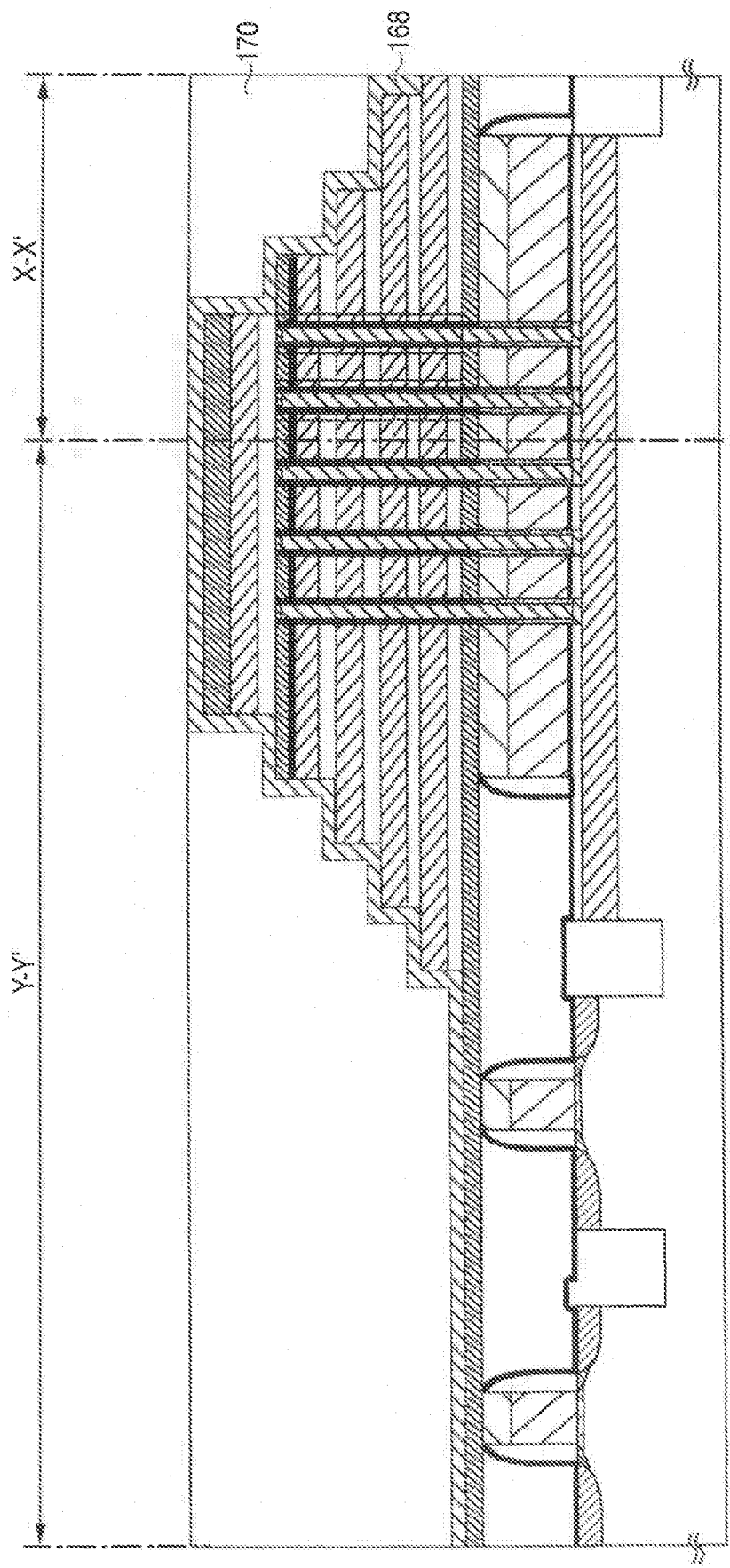
FIG. 13 is a drawing to show the manufacturing process of the nonvolatile semiconductor memory 1 according to the embodiment.

Next, a silicon nitride film 168 is formed on the full face of the substrate as shown in FIG. 13. Next, for example, a BPSG film 170 is formed and annealing treatment is performed and then CMP is performed.

Figure 14:
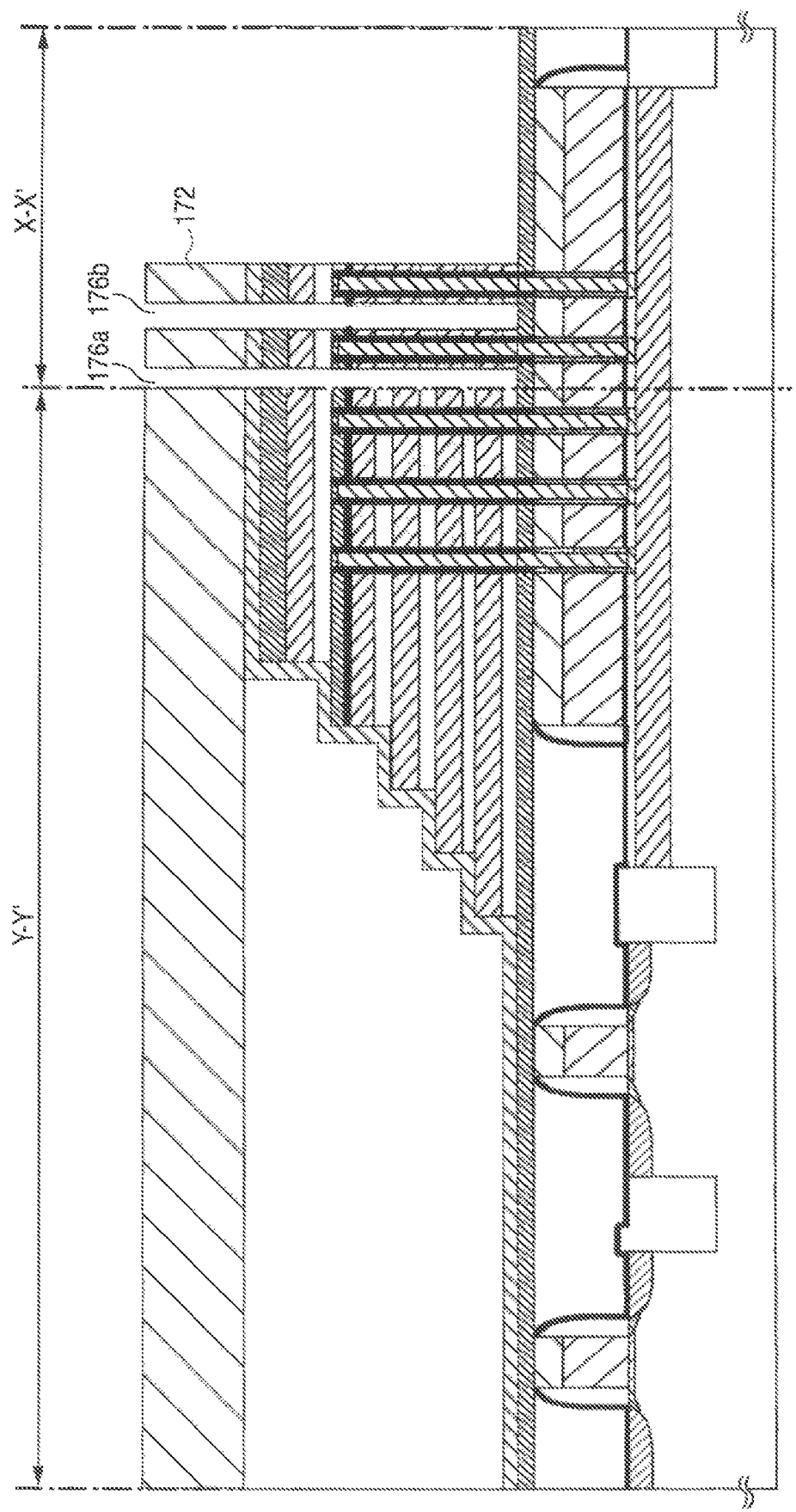
FIG. 14 is a drawing to show the manufacturing process of the nonvolatile semiconductor memory 1 according to the embodiment.

Next, a resist pattern 172 provided with slit-like holes 172a to 172c (shown in FIGS. 15A and 15B) is formed in the memory transistor region and RIE is performed on the silicon oxide film 134, the amorphous silicon film 136, the silicon oxide film 138, the amorphous silicon film 140, the silicon oxide film 142, the amorphous silicon film 144, the silicon oxide film 146, the amorphous silicon film 148, the silicon oxide film 149, the silicon nitride film 150, the silicon oxide film 160, the amorphous silicon film 162, the silicon oxide film 164, and the silicon nitride film 166 to form grooves 176a to 176c along the column of the memory plug holes, as shown in FIG. 14. FIGS. 15A and 15B are top views of the memory transistor portion. FIG. 15A is a top view of the memory transistor region formed with the resist pattern 172 provided with the slit-like holes 172a to 172c (shown in FIGS. 15A and 15B). FIG. 15B is a top view of the memory transistor region formed with the grooves 176a to 176c along the column of the memory plug holes by performing RIE. In so doing, gate electrodes of upper selection transistors are also formed at the same time. In the embodiment, the gate electrode length (the thickness of the amorphous silicon film 162) of the upper selection transistor is 180 nm, the diameter of the memory plug (the diameter of the memory plug holes 152a to 152d) is 90 nm, and the width of the slit-like hole (the width of the grooves 176a to 176c) is 90 nm. The gate electrode length of the upper selection transistor may be 110 nm, the diameter of the memory plug may be 60 nm, and the width of the slit-like hole may be 60 nm.

Figure 16:
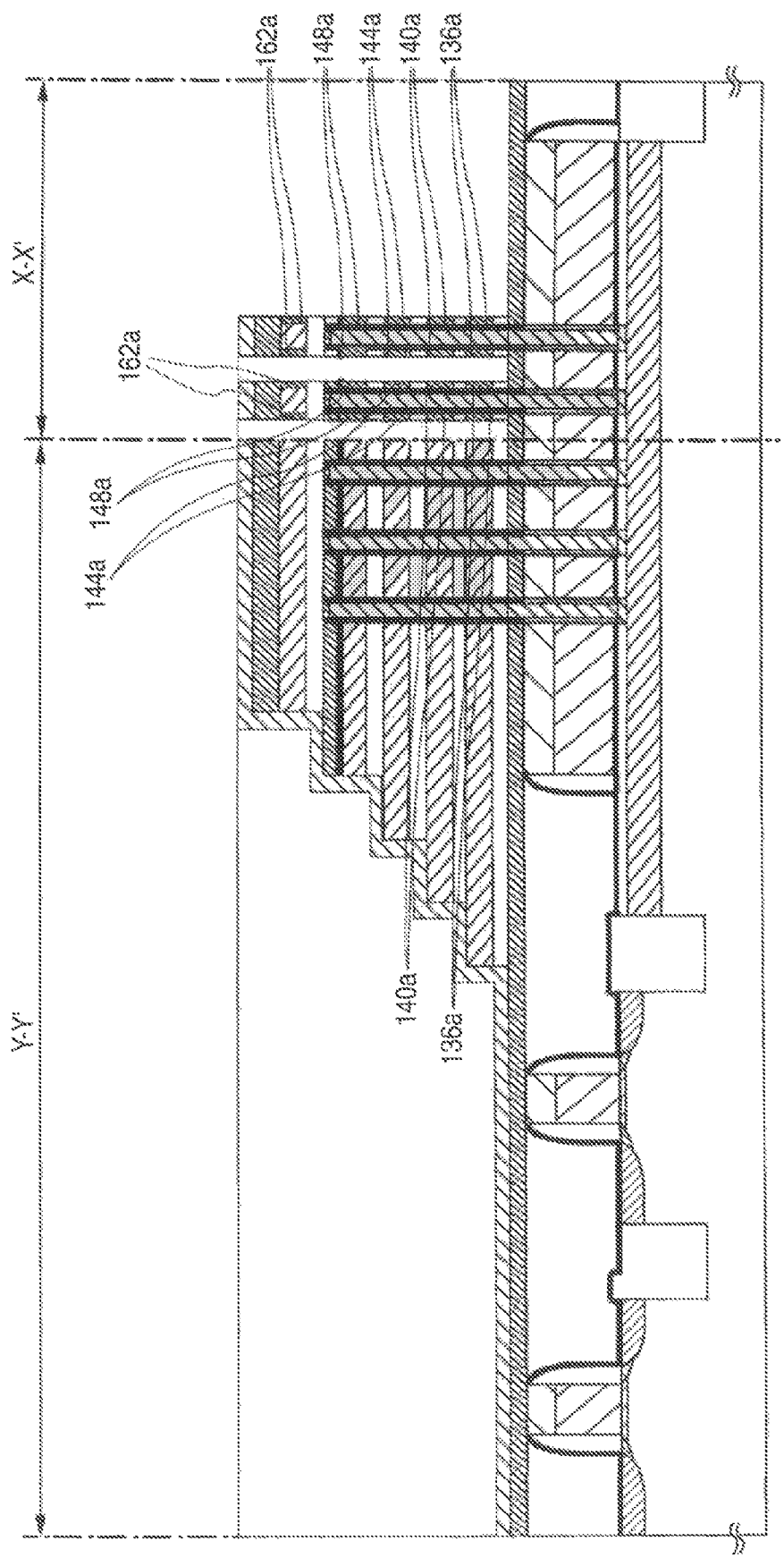
FIG. 16 is a drawing to show the manufacturing process of the nonvolatile semiconductor memory 1 according to the embodiment.

Next, a metal film (not shown) is formed on the full face of the substrate. In the embodiment, titanium (Ti) is used as the metal film. In addition to Ti, any metal capable of forming a silicide, such as cobalt (Co) or nickel (Ni), may be used as the metal film. Next, annealing treatment is performed, thereby forming with salicide (self-aligned silicide) the sides where the grooves 176a to 176c of amorphous silicon films 136, 140, 144, 148, and 162 are formed to form titanium silicides 136a, 140a, 144a, 148a and 162a, as shown in FIG. 16. The amorphous silicon films 136, 140, 144, and 148 are the word line WL of the memory transistors, and the amorphous silicon film 162 is the gate electrode of the upper selection transistor. The sides of the grooves 176a to 176c of the amorphous silicon films 136, 140, 144, 148, and 162 are formed with metal silicide, whereby the specific resistance of the metal silicide portion decreases about two digits and the resistance of the whole word line and the resistance of the gate electrode of the upper selection transistor can be decreased. Next, the surplus metal film is removed by wet etching, etc. Instead of forming the metal silicide, aluminum may be used as the metal film and annealing treatment may be performed, whereby the sides where the grooves 176a to 176c of the amorphous silicon films 136, 140, 144, and 148 are formed and the aluminum may be replaced. Likewise, aluminum may be used as the metal film and annealing treatment may be performed, whereby the amorphous silicon film 162, the gate electrode of the upper selection transistor, and the aluminum may be replaced.

To use titanium as the metal film, for example, if the thickness of the metal film is set to 6 nm, titanium having the thickness of 6 nm is completely reacted with the amorphous silicon films 136, 140, 144, 148, and 162 and the amorphous silicon films 136, 140, 144, 148, and 162 are formed with silicide, whereby if the sheet resistance of titanium silicide ($Ti_2Si$) is about $15\Omega/\square$, for example, the sheet resistance of the amorphous silicon film 136, 140, 144, 148 (word line WL) can be set to about $10\Omega/\square$.

The amorphous silicon films 136, 140, 144, and 148 and the metal film may be completely reacted with each other for putting the whole of the amorphous silicon films 136, 140, 144, and 148 into metal silicide.

Figure 17:
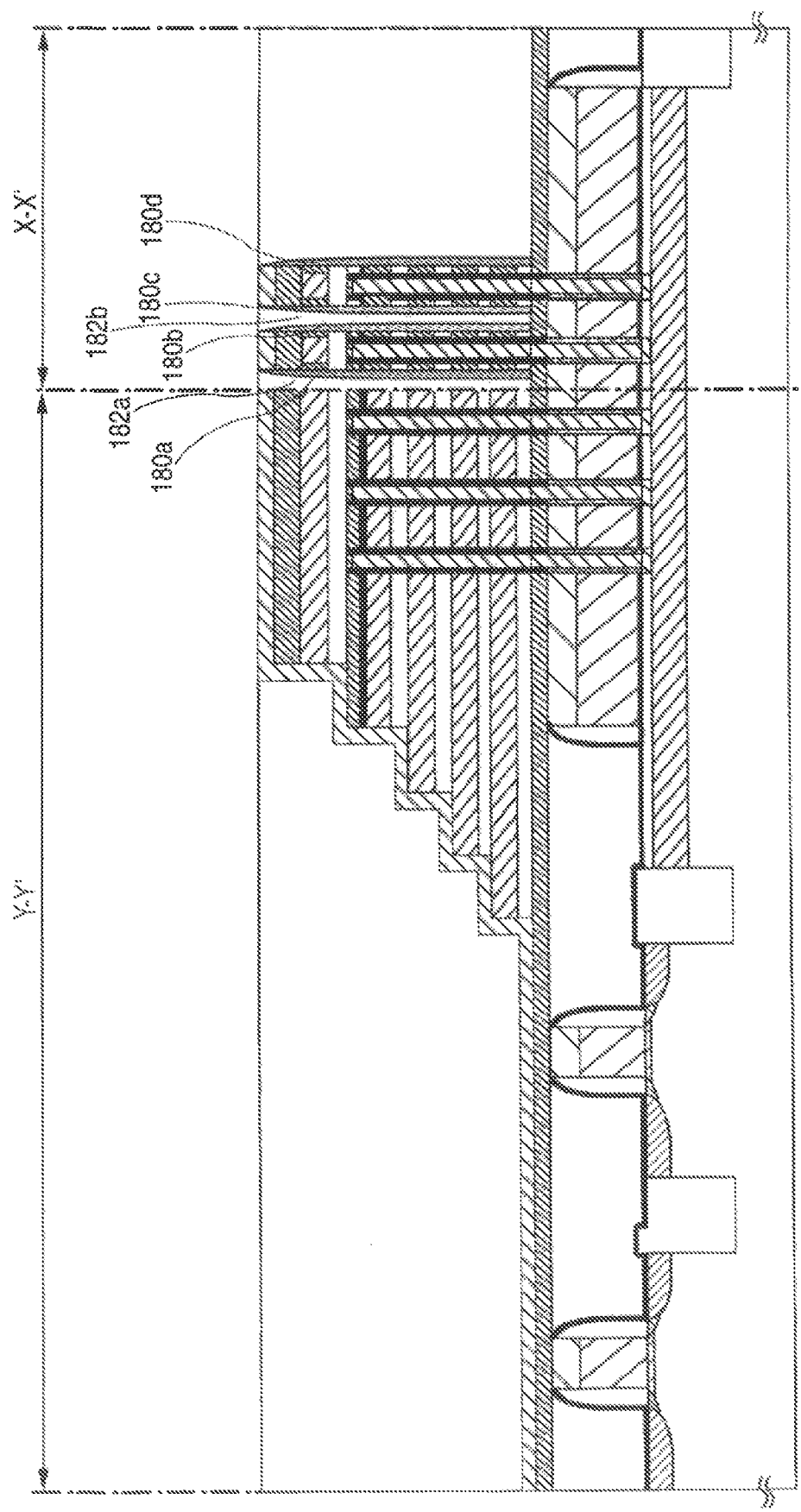
FIG. 17 is a drawing to show the manufacturing process of the nonvolatile semiconductor memory 1 according to the embodiment.

Next, a silicon nitride film 180 and a silicon oxide film 182 are formed in order so as to fill in the groove 176 and CMP is performed, thereby forming silicon nitride films 180a to 180d and silicon oxide films 182a and 182b, as shown in FIG. 17.

Figure 18:
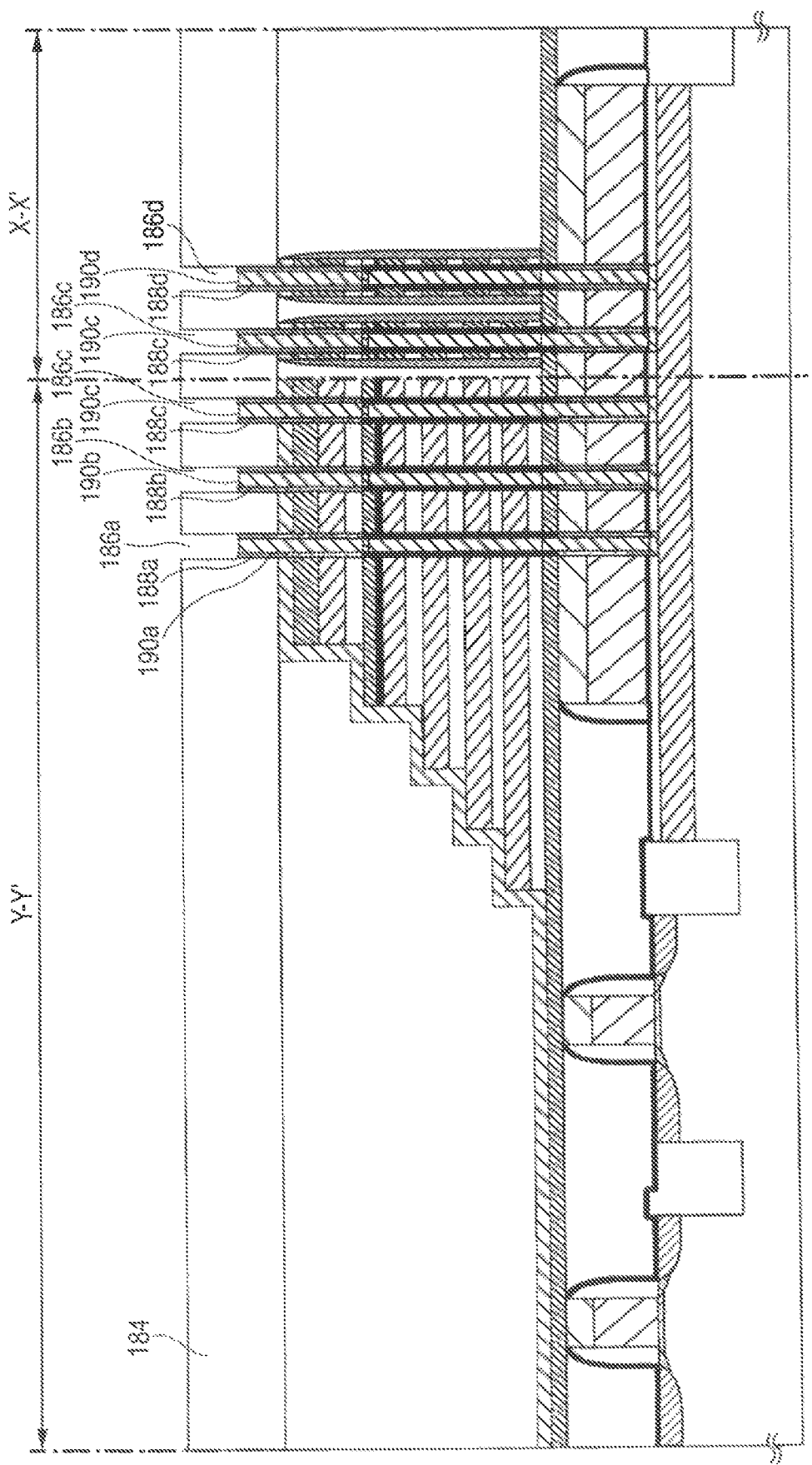
FIG. 18 is a drawing to show the manufacturing process of the nonvolatile semiconductor memory 1 according to the embodiment.

Next, a silicon oxide film 184 is formed and then holes 186a to 186d are formed so as to match the memory plug holes 152a to 152d in the memory transistor region, as shown in FIG. 18. As many holes 186a to 186d as the number of the memory strings in the memory transistor region are formed.

Then, upper selection transistors are formed according to a similar method to the method of forming the lower selection transistors. That is, P ions are implanted only into the memory transistor region and then a silicon oxide film and an amorphous silicon film are formed only are formed only on the side walls and bottoms of the holes 186a to 186d by the LPCVD method, etc. Next, the silicon oxide film and the amorphous silicon film of the holes 186a to 186d are etched by RIE to form amorphous silicon films 188a to 188d. Next, after the amorphous silicon films are formed, etching back is performed by RIE, etc., to form amorphous silicon films 190a to 190d. The surfaces of the amorphous silicon films 188a to 188d may be positioned below the top face of the silicon oxide film 184 as shown in FIG. 18. When the diffusion layer amorphous silicon films 188a to 188d on the drain side of the memory string are formed, it is desirable that the amorphous silicon films 188a to 188d which will become the diffusion layer on the drain side and the upper selection gate electrode should be brought close to each other as much as possible.

Figure 19:
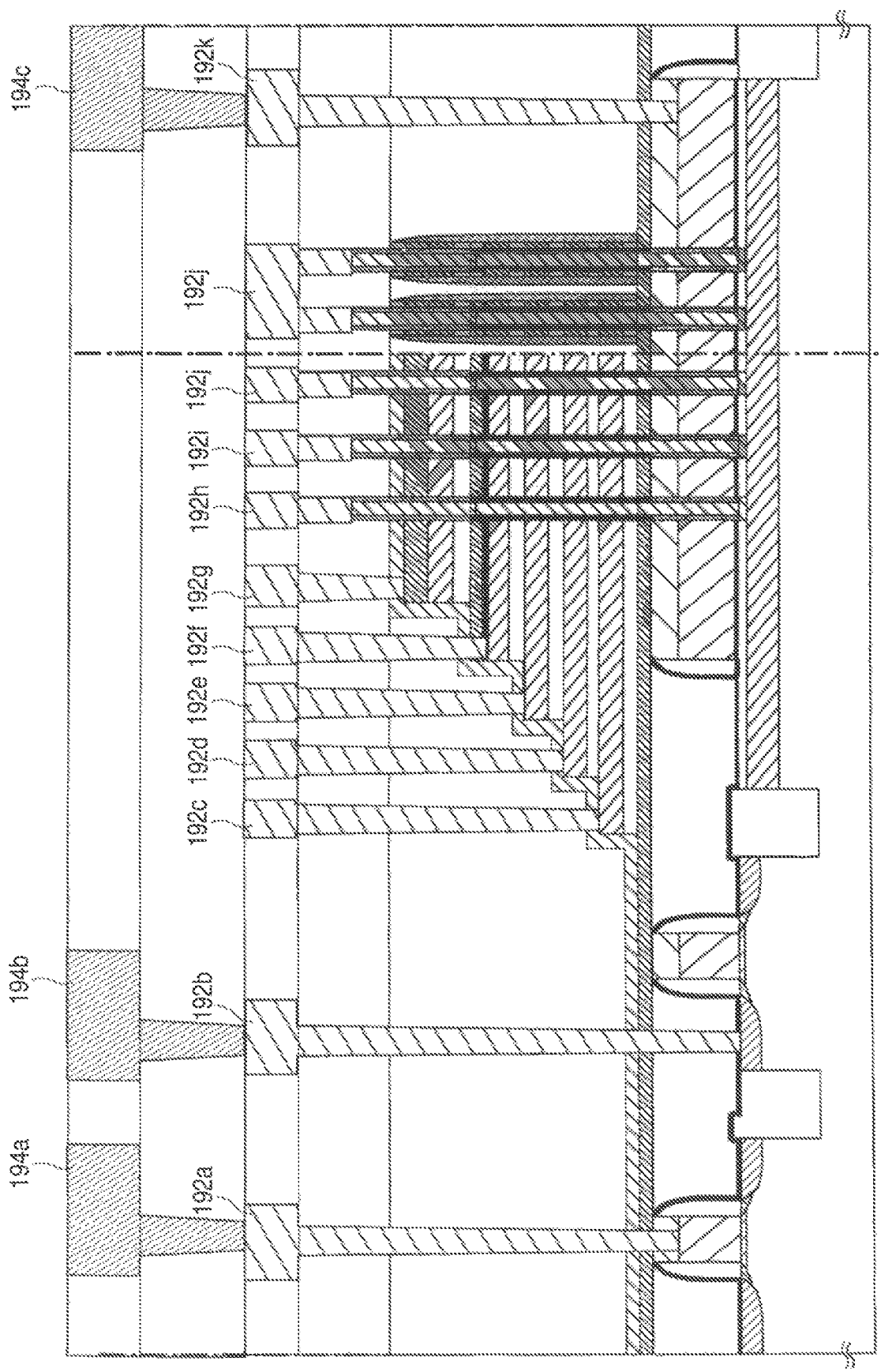
FIG. 19 is a drawing to show the manufacturing process of the nonvolatile semiconductor memory 1 according to the embodiment.

Then, via holes are formed, a metal film which will become barrier metal (for example, Ti/TiN) is formed, a metal film (for example, tungsten) is formed, and planarization is performed by CMP, etc. Next, an insulating film of silicon oxide, etc., is formed, a groove is formed, a metal film which will become barrier metal (for example, Ti/TiN) is formed, a metal film (for example, tungsten (W)) is formed, and planarization is performed by CMP, etc., thereby forming wirings 192a to 192k, etc. Then, a similar process is repeated, thereby forming wirings 194a to 194c, etc. A similar process is repeated, thereby forming connection wiring between the wirings. Through the above processes, the nonvolatile semiconductor memory 1 according to the first embodiment is complete as shown in FIG. 19.

In the embodiment, four layers of amorphous silicon films which will become word lines are stacked by way of example, but the embodiment is not limited to the mode; the numbers of the amorphous silicon films and the silicon oxide films to be stacked can be adjusted as required.

In the nonvolatile semiconductor memory 1 according to the embodiment, the sides of the linear portions forming the word line (WL) 7 of each layer are formed with metal silicide. This means that the sides of the slits formed in the word line (WL) 7 of each layer are formed with metal silicide. Thus, the word line (WL) 7 is put into lower resistance. Therefore, the nonvolatile semiconductor memory 1 according to the embodiment provides small signal attenuation and delay of the word lines WL and can operate at high speed.

Second Embodiment

In the first embodiment described above, a slit is formed for each memory string column as shown in FIG. 2 and the sides of each slit are formed with metal silicide. In a second embodiment, an example will be discussed wherein a slit is provided every several memory string columns and the sides of each slit are formed with metal silicide instead of forming a slit for each memory string column.

Figure 20:
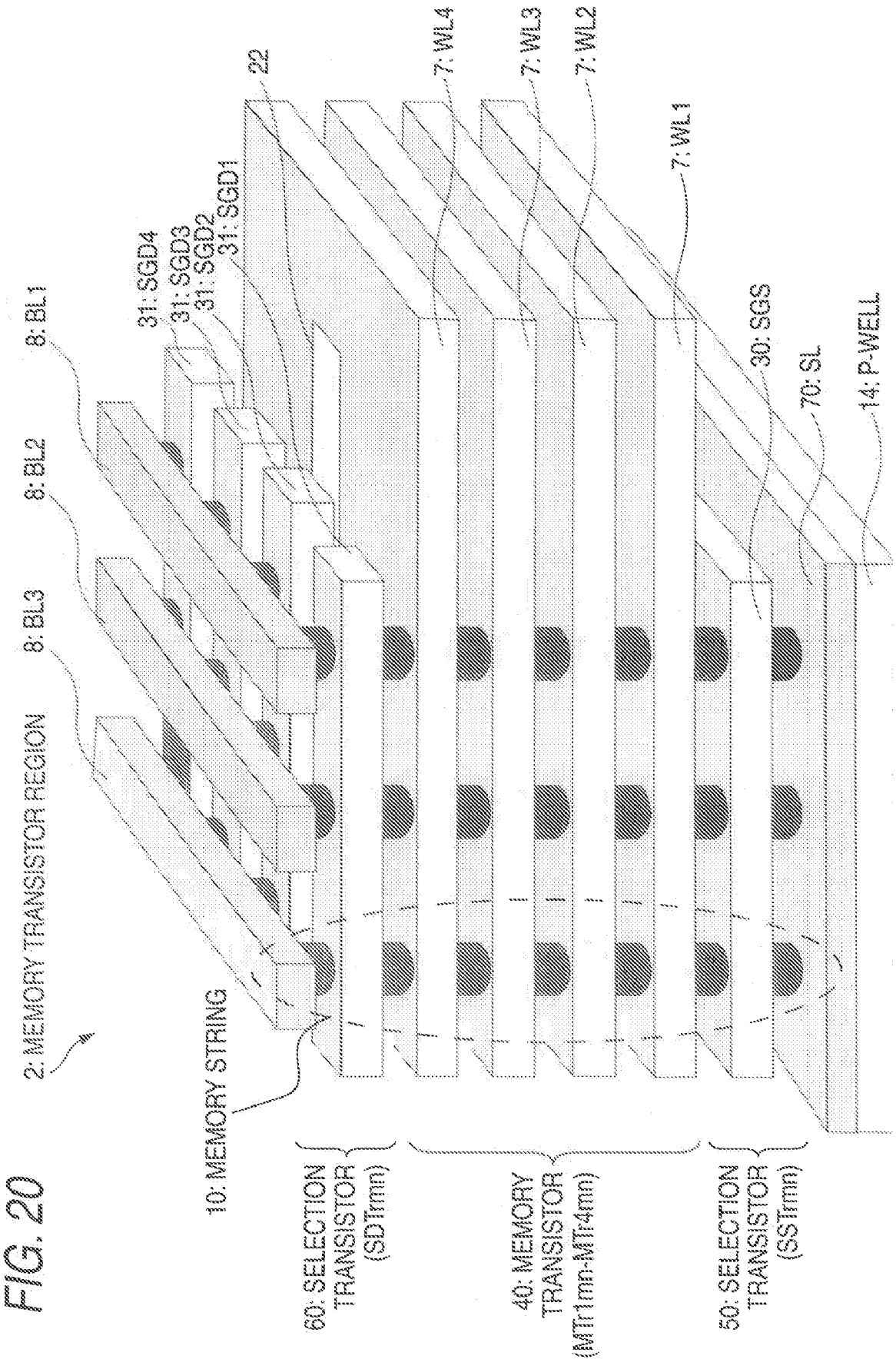
FIG. 20 is a drawing to show the schematic configuration of a part of a memory transistor region 2 of a nonvolatile semiconductor memory 1 according to a second embodiment.

FIG. 20 is a drawing to show the schematic configuration of a part of a memory transistor region 2 of a nonvolatile semiconductor memory 1 according to the second embodiment. In the embodiment, the memory transistor region 2 has m×n memory strings 10 (where m and n are each a natural number) each made up of memory transistors (MTr1mn to MTr4mn) 40 and selection transistors SSTrmn 50 and SDTrmn 60. In FIG. 20, m=3 and n=4 by way of example, as with the first embodiment. Components similar to those of the nonvolatile semiconductor memory 1 according to the first embodiment will not be discussed again.

The sides of slits formed in a word line (WL) 7 of each layer are formed with metal silicide 22, as shown in FIG. 20. In the nonvolatile semiconductor memory 1 according to the embodiment, a slit is provided every predetermined numbers of memory string columns (every two memory string columns, in FIG. 20) and the sides of each slit are formed with metal silicide 22. How many memory string columns each slit is to be provided every may be set in response to the resistance of the word line (WL) 7.

A manufacturing process of the nonvolatile semiconductor memory 1 according to the second embodiment will be discussed. Components and process similar to those of the first embodiment will not be discussed again. In the second embodiment, the layer for forming upper selection transistors is formed after the word line (WL) is formed with slits (grooves). In the following manufacturing process, an example will be discussed wherein each slit (groove) along memory plug holes is provided every three columns of memory plug holes.

As described above in the first embodiment, using a spacer of an amorphous silicon film formed in memory plug holes 152a to 152d, a silicon oxide film, a silicon nitride film, and a silicon oxide film are etched to expose parts of amorphous silicon films 130a to 130d formed in holes 126a to 126d. Next, amorphous silicon films 156a to 156d are formed so as to fill in the memory plug holes 152a to 152d and then planarization is performed by CMP, etc. Next, As ions are implanted and RTA is performed, thereby forming drain diffusion layers 158a to 158d (FIG. 21).

Next, a resist is formed in a memory transistor region and etching is performed and then the resist is slimmed and further etching is performed. This process is repeated, thereby treating a silicon oxide film 134, an amorphous silicon film 136, a silicon oxide film 138, an amorphous silicon film 140, a silicon oxide film 142, an amorphous silicon film 144, a silicon oxide film 146, an amorphous silicon film 148, a silicon oxide film 149, and a silicon nitride film 150 stepwise as shown in FIG. 21.

Figure 21:
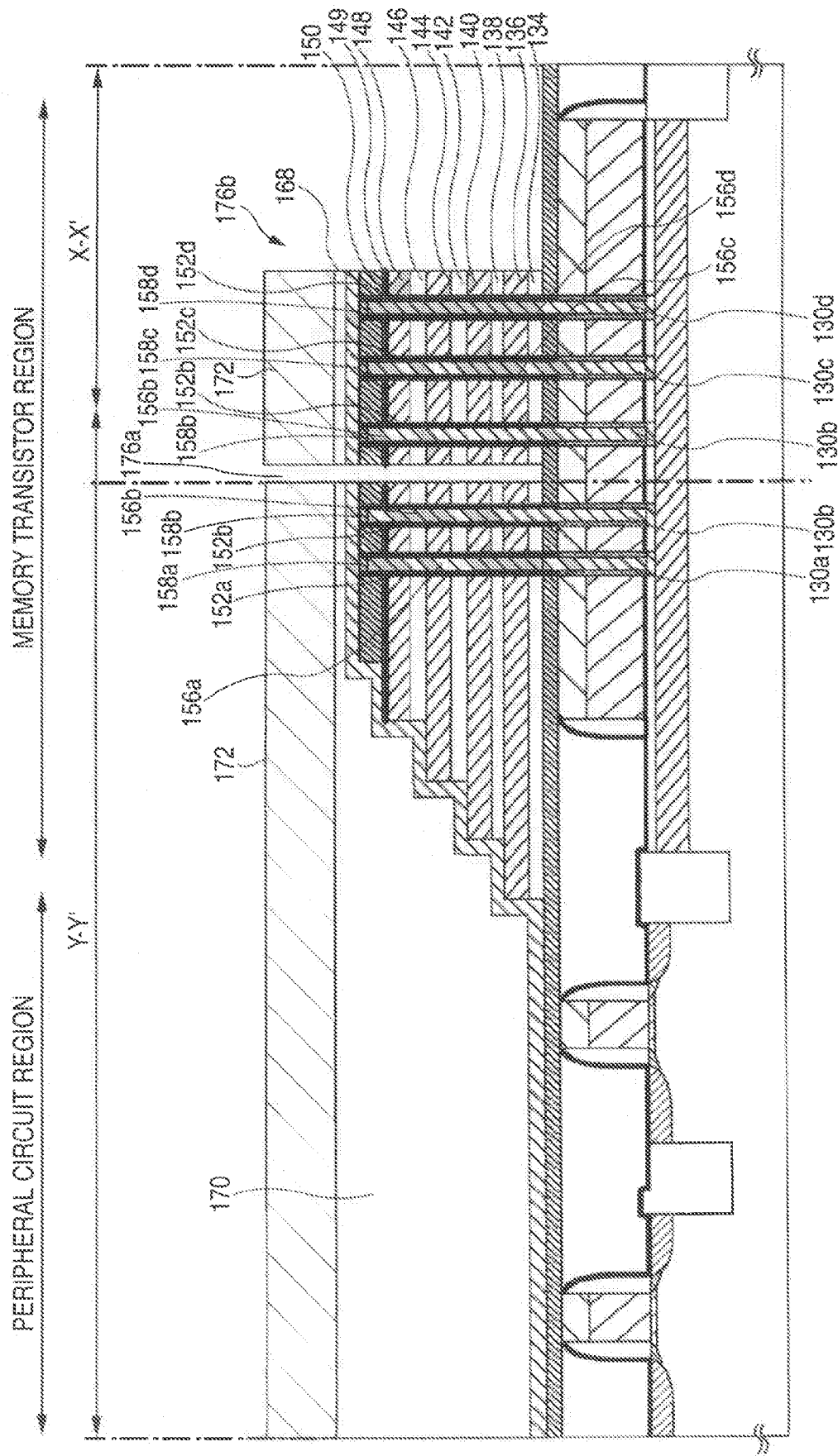
FIG. 21 is a drawing to show the manufacturing process of the nonvolatile semiconductor memory 1 according to the embodiment.
Figure 22:
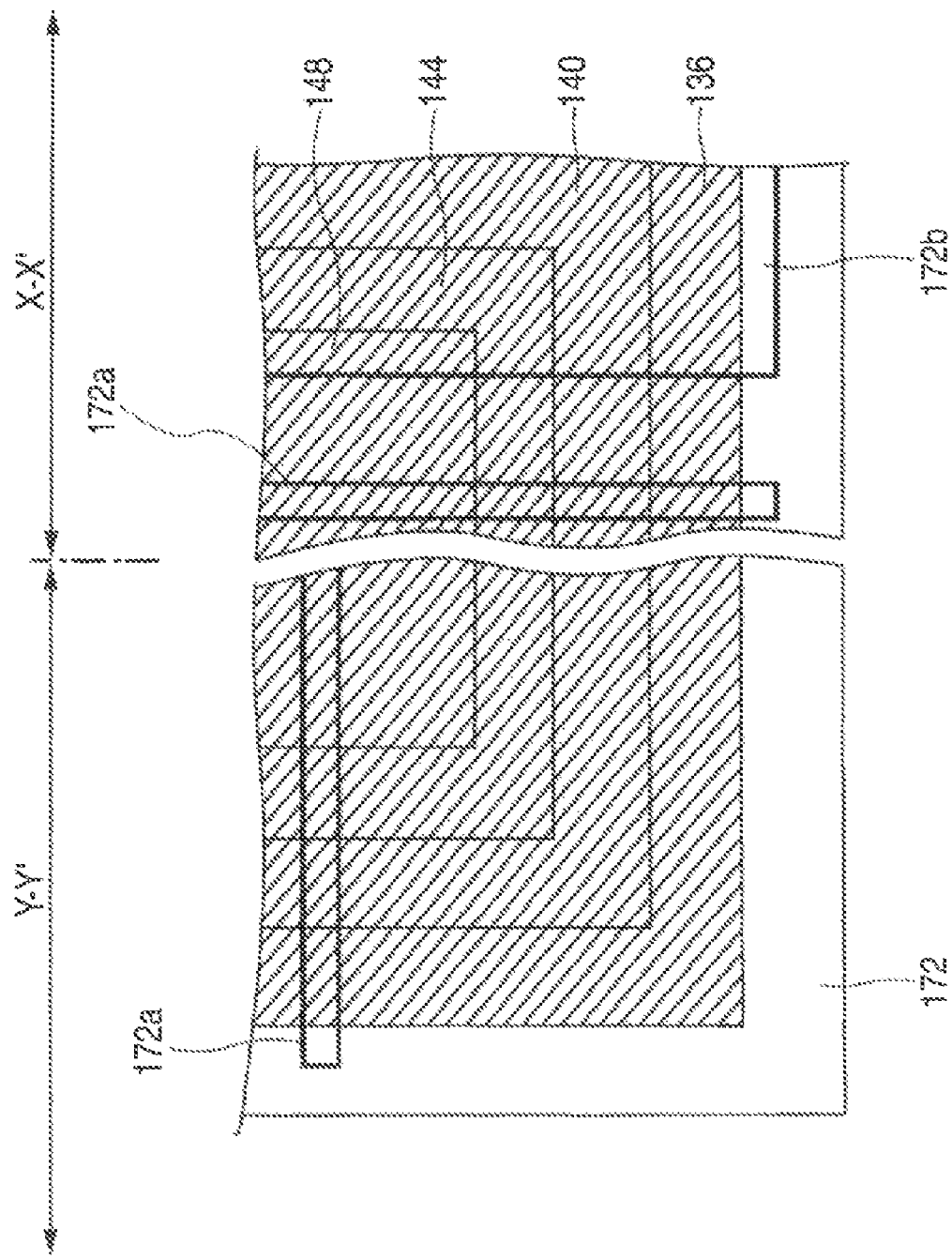
FIG. 22 is a top view of the nonvolatile semiconductor memory 1 according to the embodiment.

Next, a silicon nitride film 168 is formed on the full face of a substrate as shown in FIG. 21. Next, for example, a BPSG film 170 is formed and annealing treatment is performed and then CMP is performed. Next, a resist pattern 172 provided with slit-like holes 172a and 172b is formed in the memory transistor region and RIE is performed on the silicon oxide film 134, the amorphous silicon film 136, the silicon oxide film 138, the amorphous silicon film 140, the silicon oxide film 142, the amorphous silicon film 144, the silicon oxide film 146, the amorphous silicon film 148, the silicon oxide film 149, the silicon nitride film 150, and a silicon nitride film 168 to form the grooves 176a and 176b, as shown in FIG. 21. The grooves 172a and 172b are provided along the memory plug holes every three columns of the memory plug holes. FIG. 22 is a top view of the memory transistor region formed with the resist pattern 172 provided with the slit-like holes 172a and 172b. In the embodiment, the slits (grooves) along the memory plug holes are provided every three columns of the memory plug holes, but the nonvolatile semiconductor memory 1 according to the embodiment is not limited to the mode. For example, the slits (grooves) may be provided every blocks for erasing operation.

Figure 23:
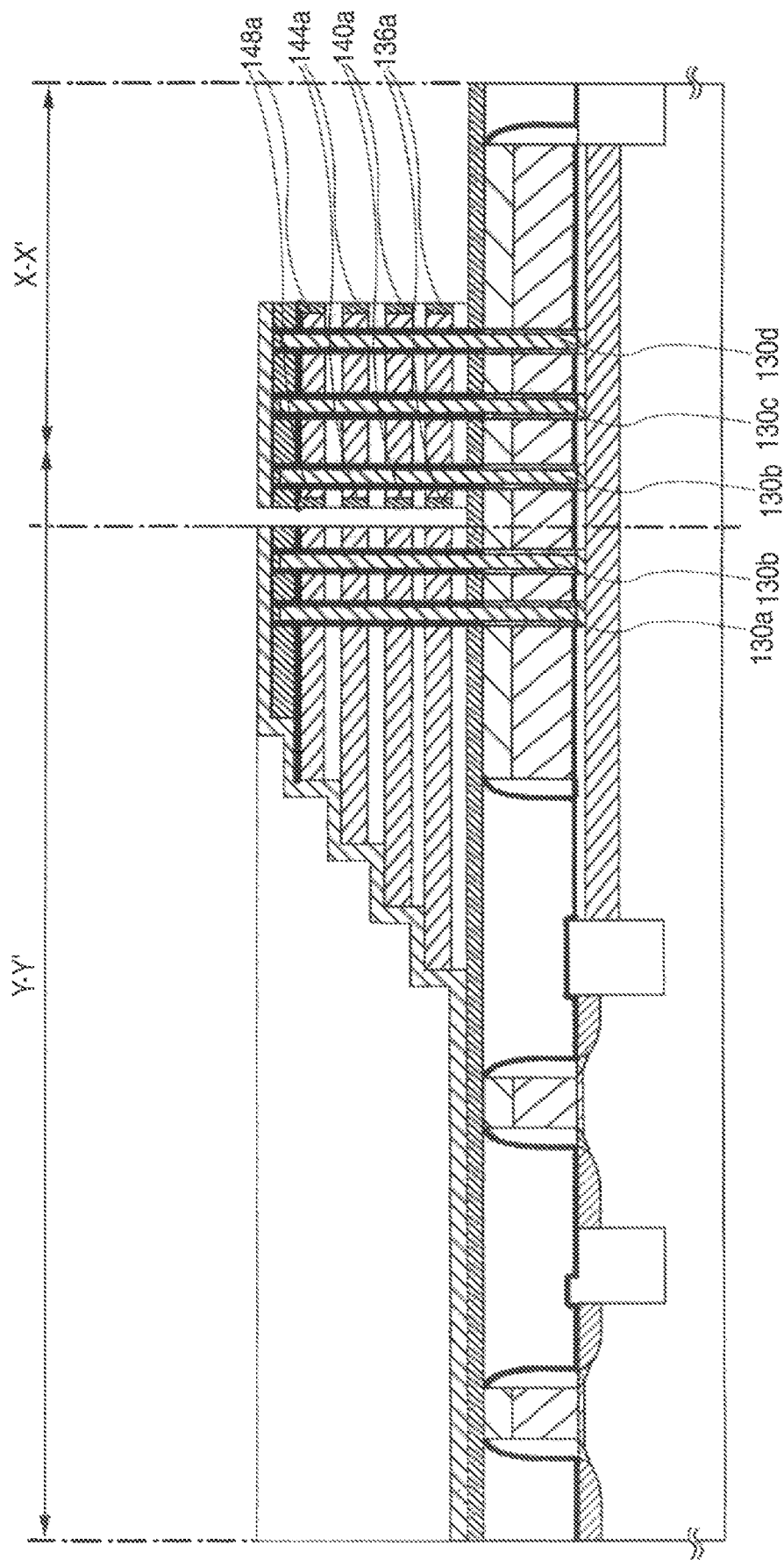
FIG. 23 is a drawing to show the manufacturing process of the nonvolatile semiconductor memory 1 according to the embodiment.
Figure 24:
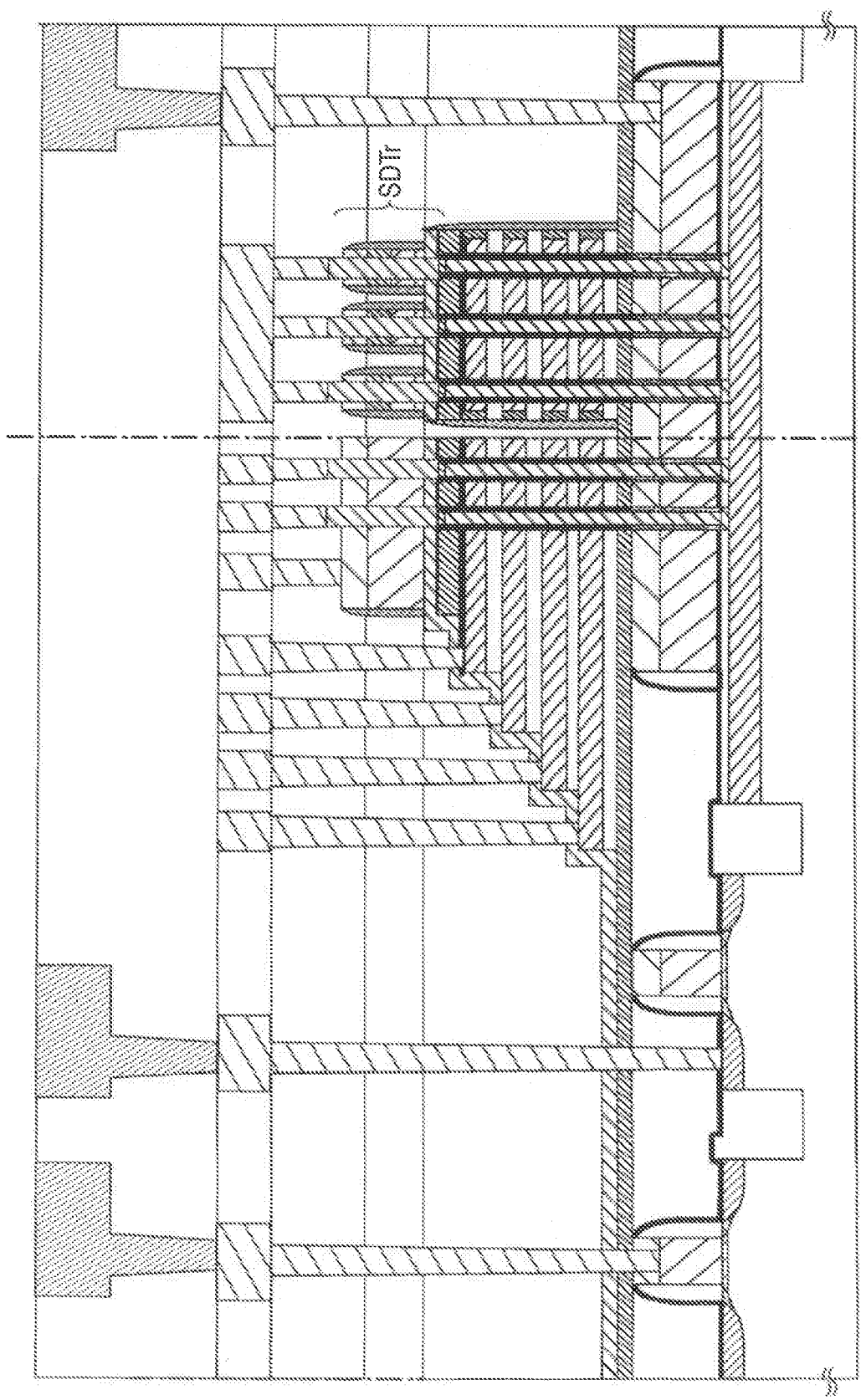
FIG. 24 is a drawing to show the manufacturing process of the nonvolatile semiconductor memory 1 according to the embodiment.

Next, a metal film (not shown) is formed on the full face of the substrate. In the embodiment, titanium (Ti) is used as the metal film. In addition to Ti, any metal capable of forming a silicide, such as cobalt (Co) or nickel (Ni), may be used as the metal film, as with the first embodiment. Next, annealing treatment is performed, thereby forming with salicide the sides where grooves 176a and 176b of amorphous silicon films 136, 140, 144, and 148 are formed to form titanium silicides 136a, 140a, 144a, 148a, as shown in FIG. 23. The amorphous silicon films 136, 140, 144, and 148 are the word line WL of memory transistors, and the sides of the grooves 176a and 176b of the amorphous silicon films 136, 140, 144, and 148 are formed with metal silicide, whereby the specific resistance of the metal silicide portion decreases about two digits and the resistance of the whole word line can be decreased. Next, the surplus metal film is removed by wet SH, etc. Instead of forming the metal silicide, aluminum may be used as the metal film and annealing treatment may be performed, whereby the sides where the grooves 176a and 176b of the amorphous silicon films 136, 140, 144, and 148 are formed and the aluminum may be replaced.

The amorphous silicon films 136, 140, 144, and 148 and the metal film may be completely reacted with each other for putting the whole of the amorphous silicon films 136, 140, 144, and 148 into metal silicide.

Then, upper selection transistors, wiring, and the like are formed through a similar process to that of the first embodiment and the nonvolatile semiconductor memory 1 according to the second embodiment is complete. Also in the embodiment, the sides of gate electrodes of upper selection transistors (SDTr) are formed with salicide and metal silicide is formed.

Figure 25:
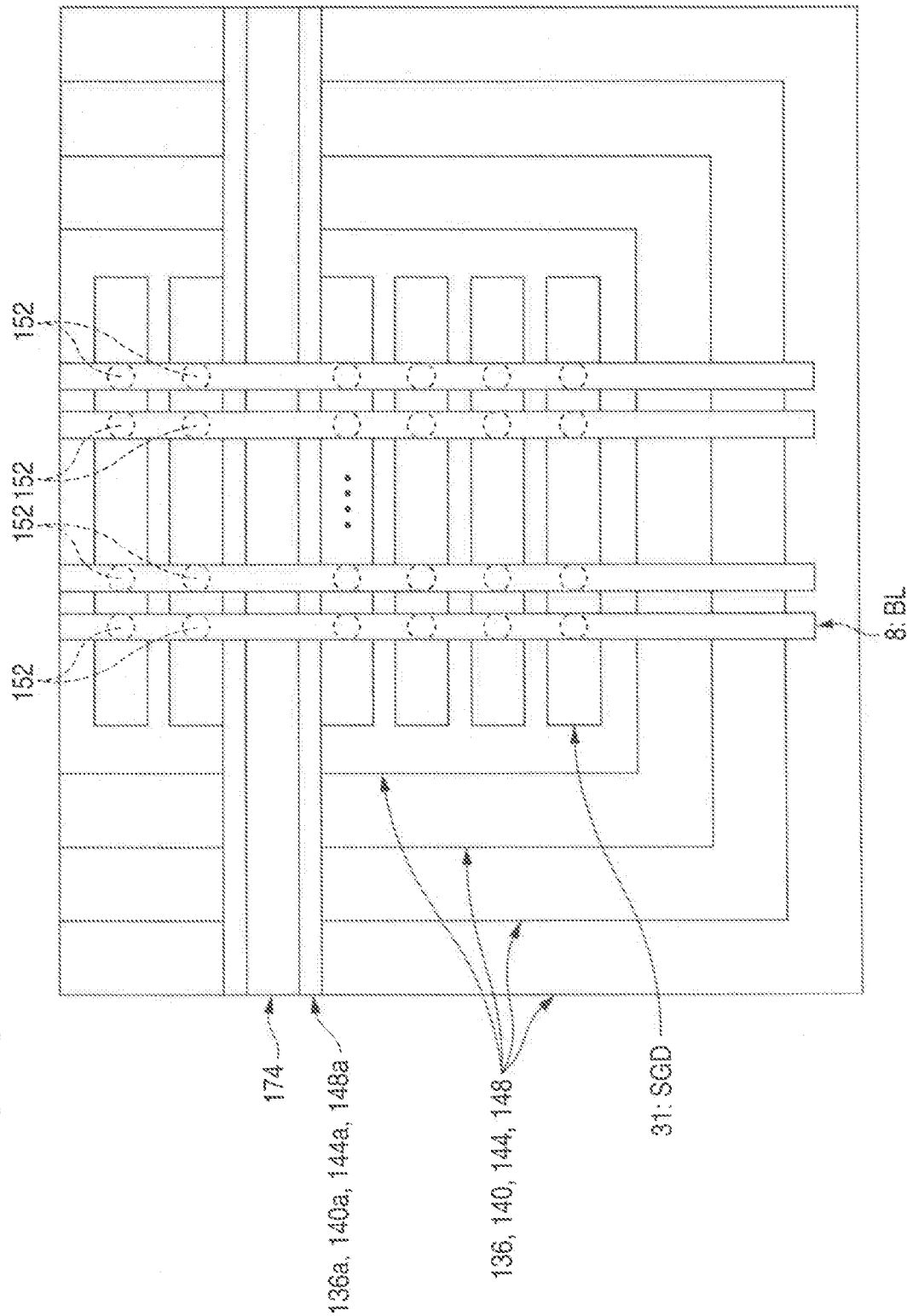
FIG. 25 is a top view of the nonvolatile semiconductor memory 1 according to the embodiment.

FIG. 25 is a top view of the memory transistor region in an example wherein a slit (groove) along the memory plug holes is provided every four columns of the memory plug holes 152.

Figure 26:
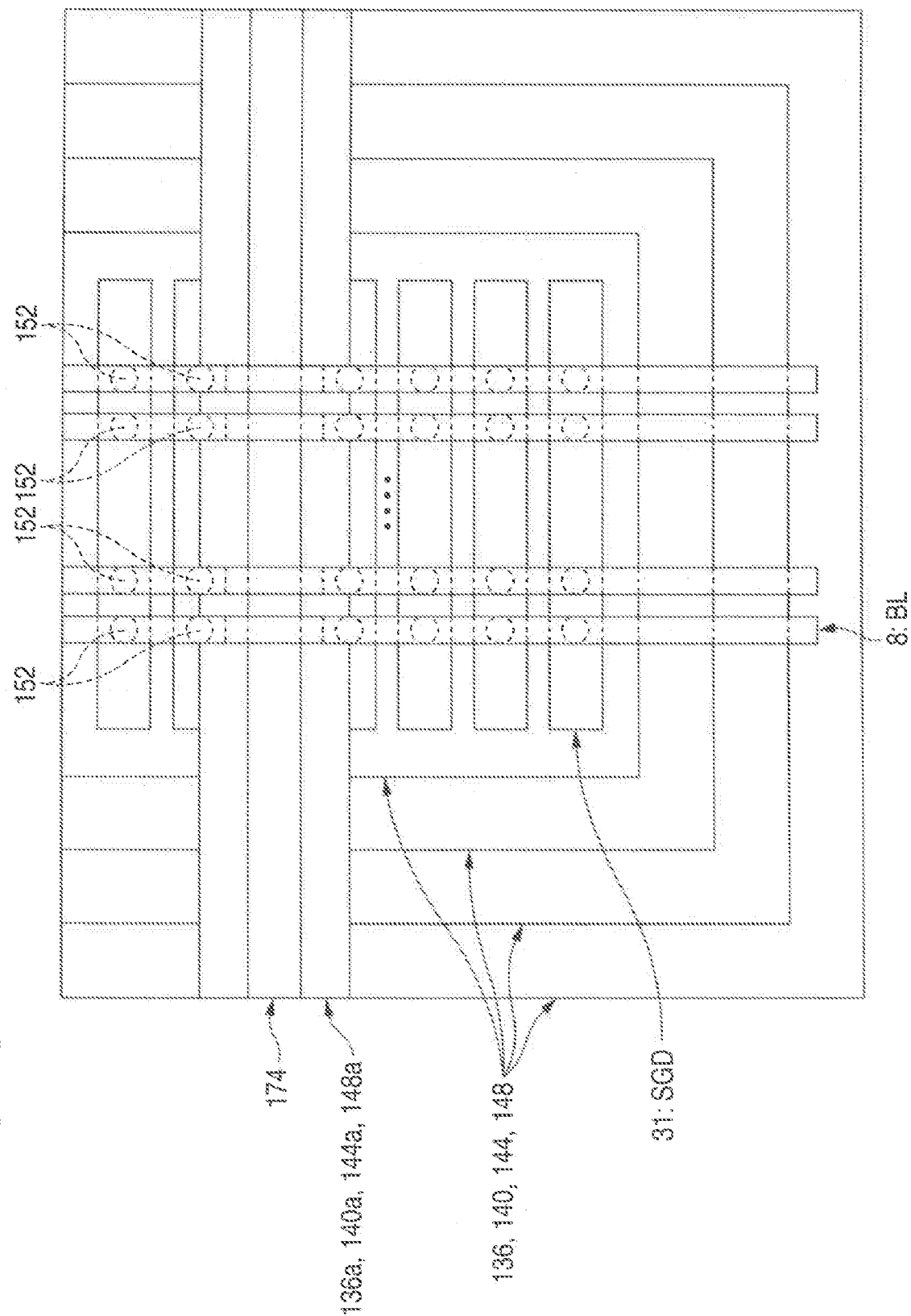
FIG. 26 is a top view of the nonvolatile semiconductor memory 1 according to the embodiment.

FIG. 26 is a top view of the memory transistor region in an example wherein some of the memory plug holes 152 are formed with metal silicide. In the case shown in FIG. 26, the resistance of the word line WL can be more decreased.

Figure 27:
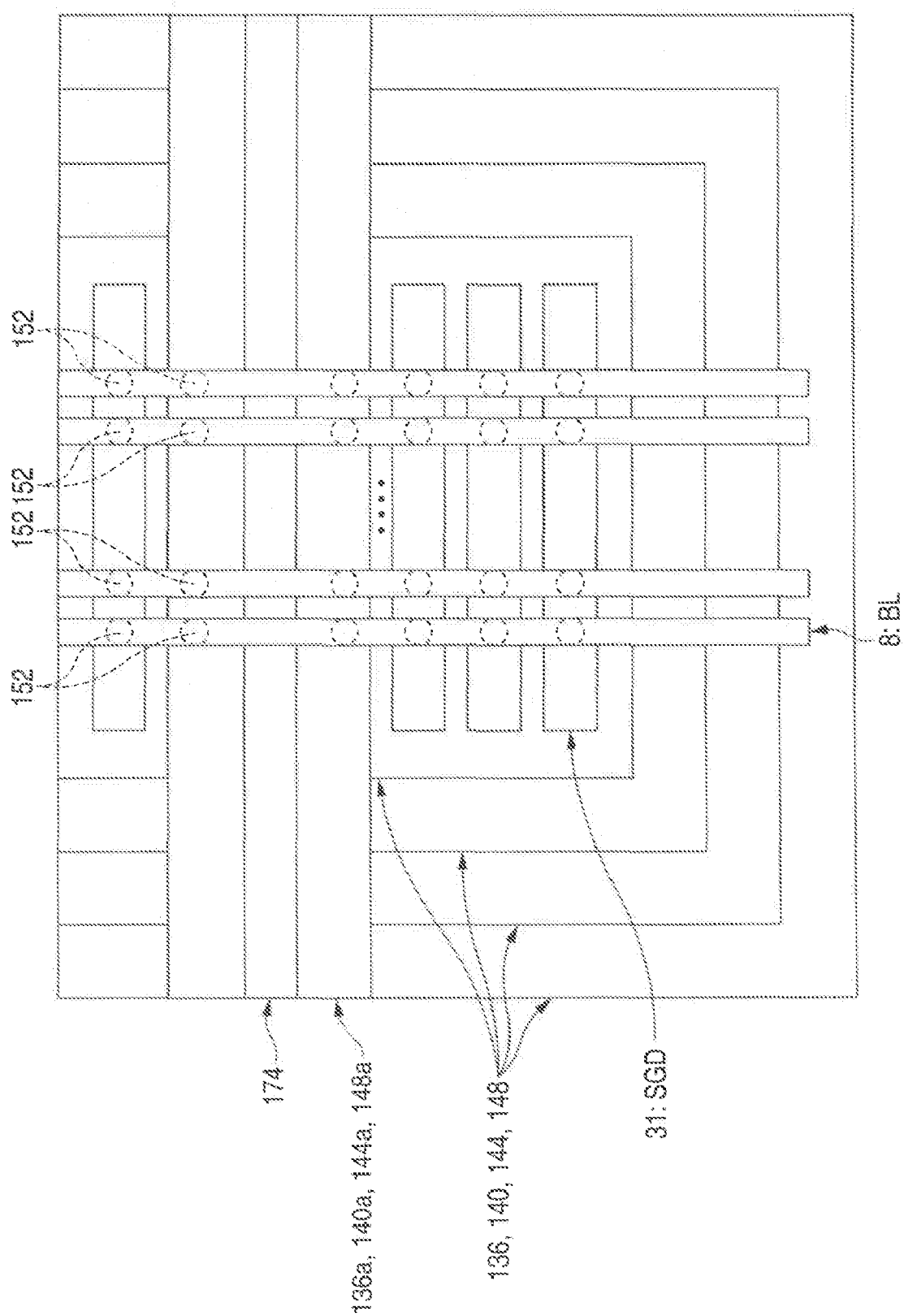
FIG. 27 is a top view of the nonvolatile semiconductor memory 1 according to the embodiment.

FIG. 27 is a top view of the memory transistor region in an example wherein the memory plug holes adjacent to the slit (groove) 174 are completely formed with metal silicide. Also in the case shown in FIG. 27, the resistance of the word line WL can be more decreased.

As shown in FIGS. 25 to 27, the thickness of the silicide formed on the side of each slit (groove) of the word line (WL) is controlled, whereby the resistance of the whole word line can be controlled.

Figure 28A:
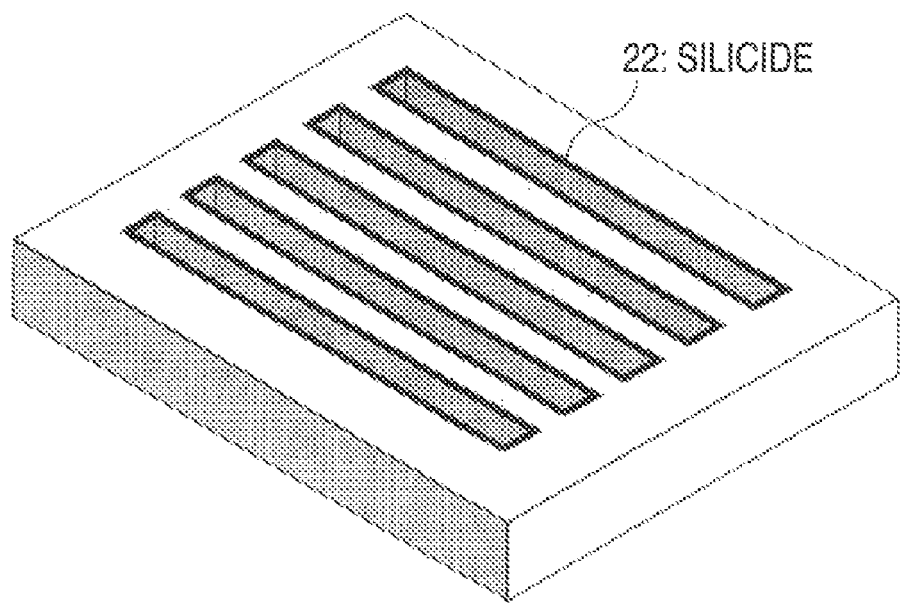
FIGS. 28A and 28B are drawings to show the schematic shape of word line of the nonvolatile semiconductor memory 1 according to the embodiment.
Figure 28B:
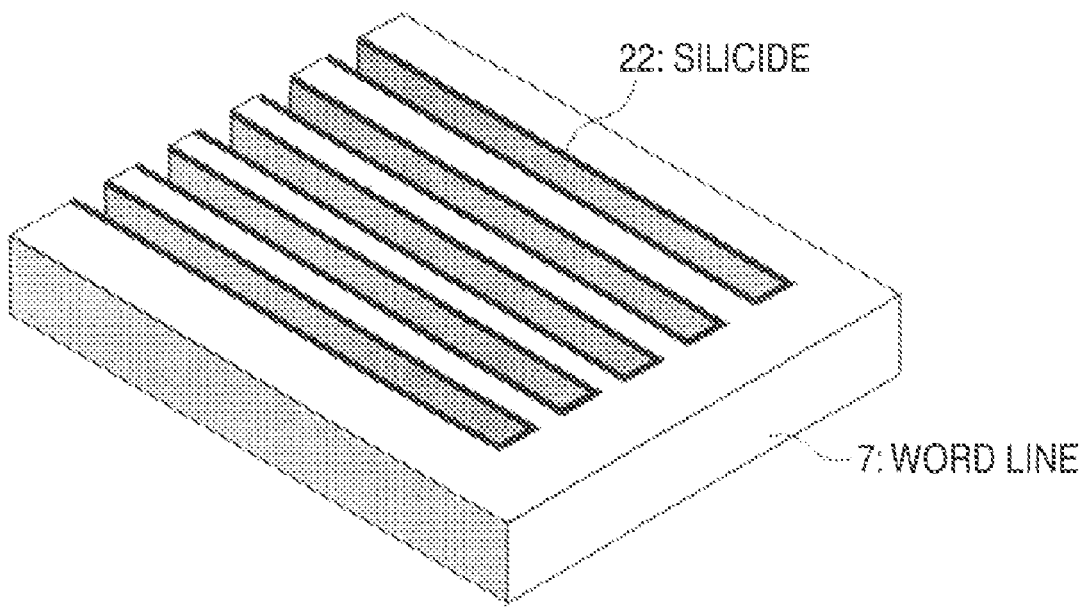

The shape of the slit is not limited to those shown in FIGS. 28A and 28B. The slit may be formed in various shapes as shown in FIGS. 29 to 32. In FIGS. 29 to 32, only the top layer of the word lines (WL) 7 is shown.

Figure 29:
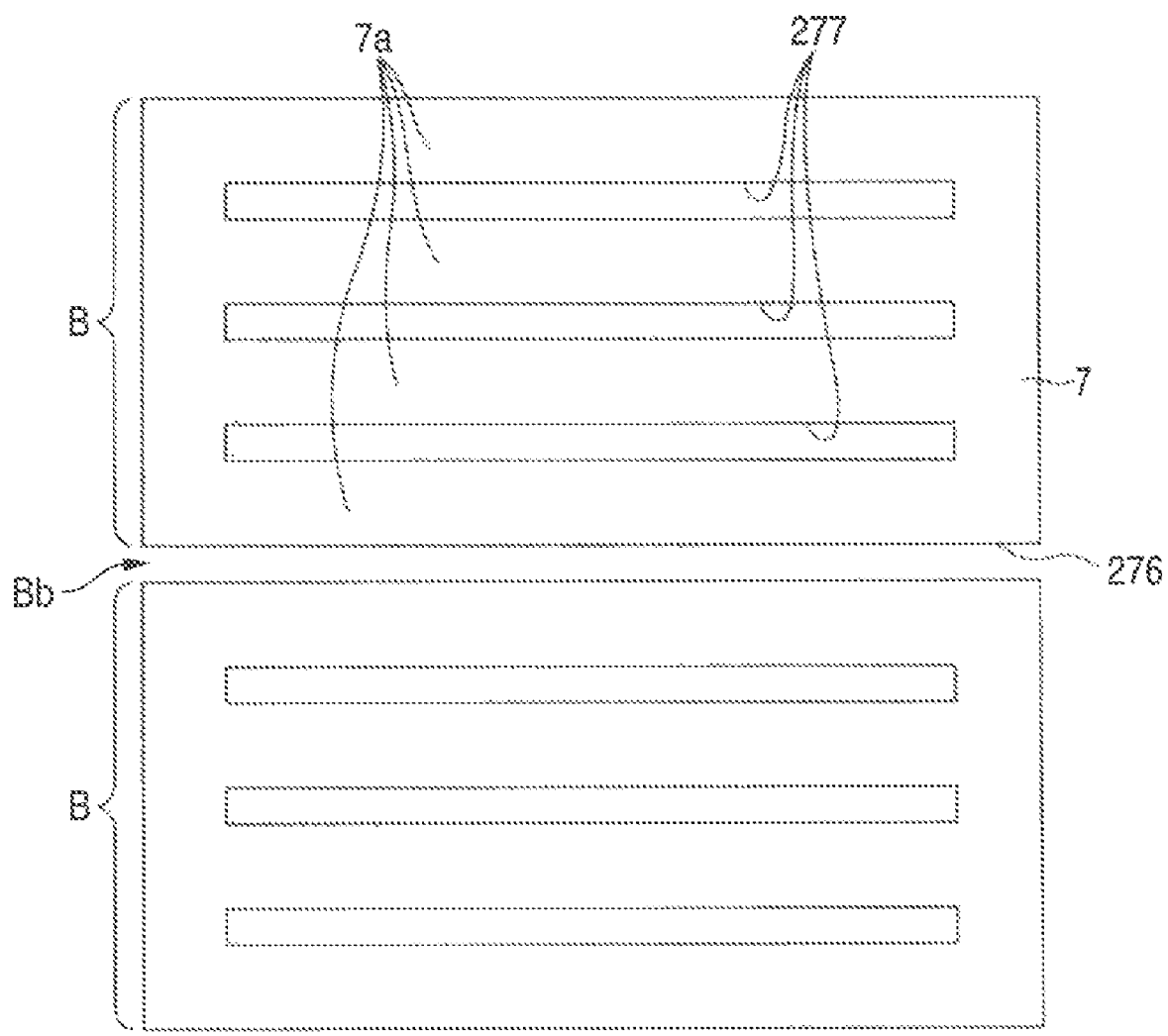
FIG. 29 shows an example of the forming pattern of the slits.

FIG. 29 shows an example of the forming pattern of the slits (grooves). In this pattern, word lines (WL) are divided into blocks B by a slit 276 formed on a boundary Bb of the blocks B. In each block B, slits 277 are formed for each memory string column, and linear portions 7a of the word line (WL) 7 are connected with each other at both ends thereof.

Figure 30:
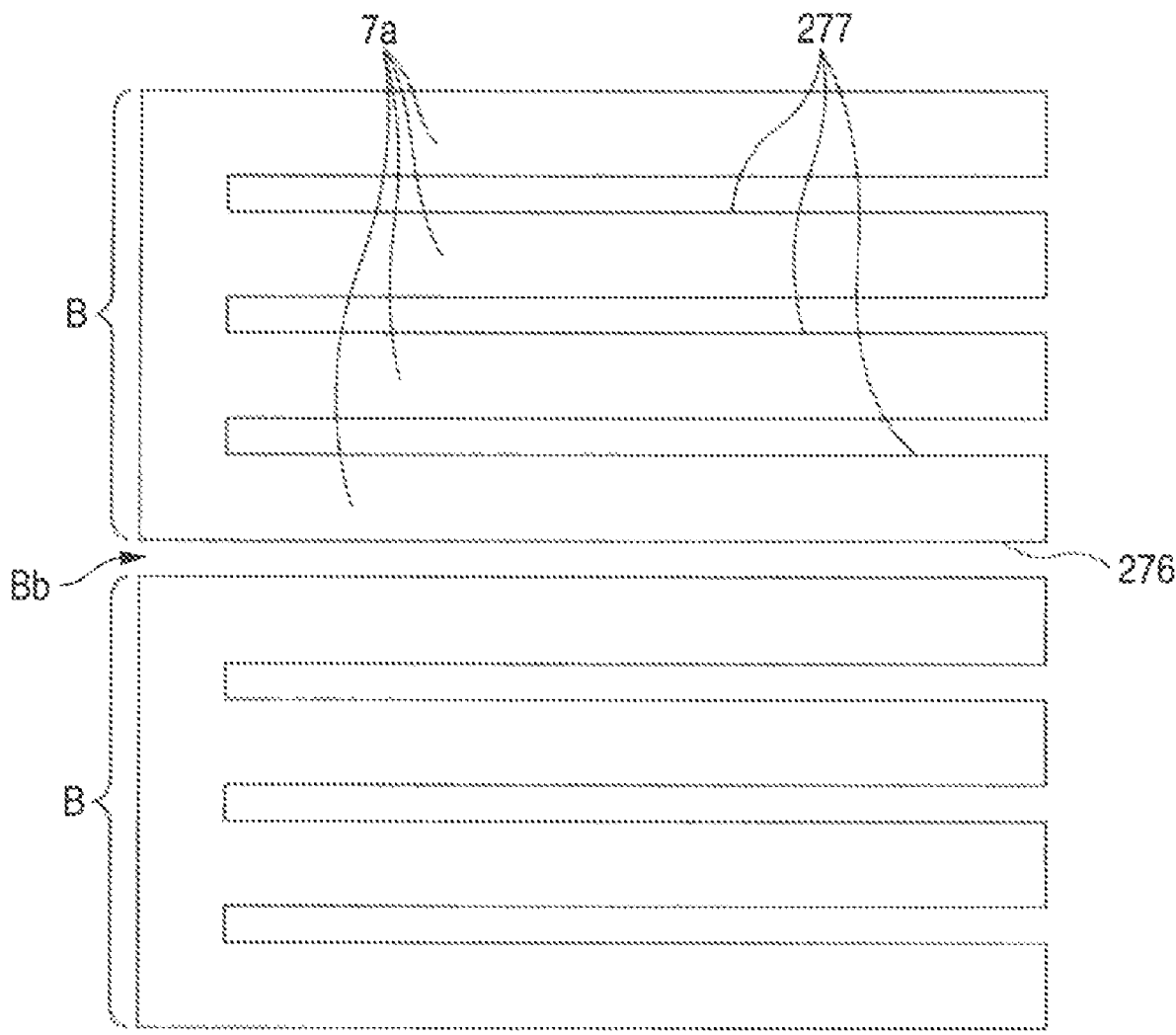
FIG. 30 shows another example of the forming pattern of the slits.

FIG. 30 shows another example of the forming pattern of the slits (grooves). In this pattern, word lines (WL) are divided into blocks B by a slit 276 formed on a boundary Bb of the blocks B. In each block B, slits 277 are formed for each memory string column, and linear portions 7a of the word line (WL) 7 are connected with each other at one ends thereof.

Figure 31:
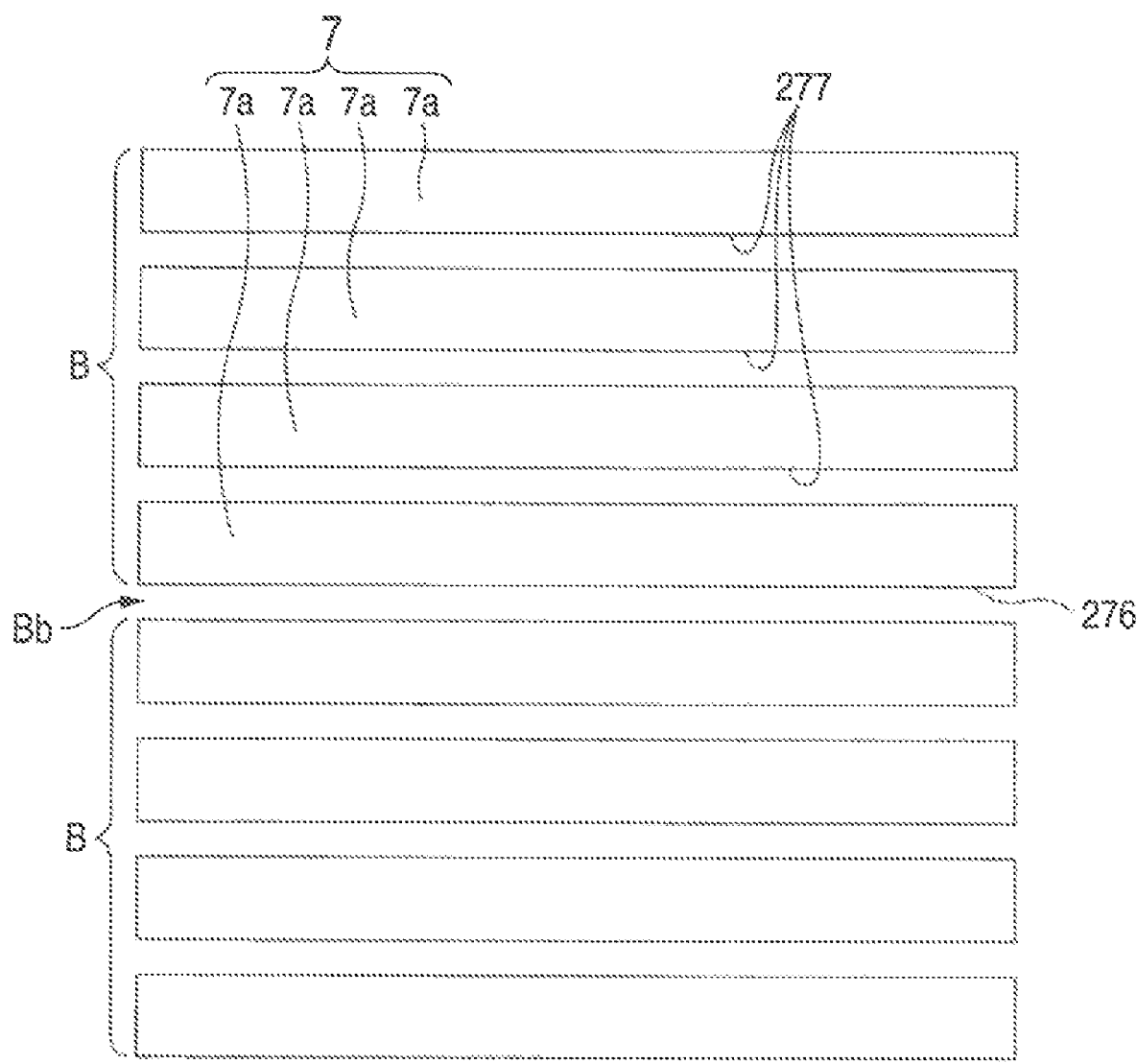
FIG. 31 shows still another example of the forming pattern of the slits.

FIG. 31 shows still another example of the forming pattern of the slits (grooves). In this pattern, word lines (WL) are divided into blocks B by a slit 276 formed on a boundary Bb of the blocks B. In each block B, slits 277 are formed for each memory string column. Linear portions 7a of the word Line (WL) 7 are separated from one another, and the same voltage is supplied on the each of linear portions 7a, for example, by the word line drive circuit.

Figure 32:
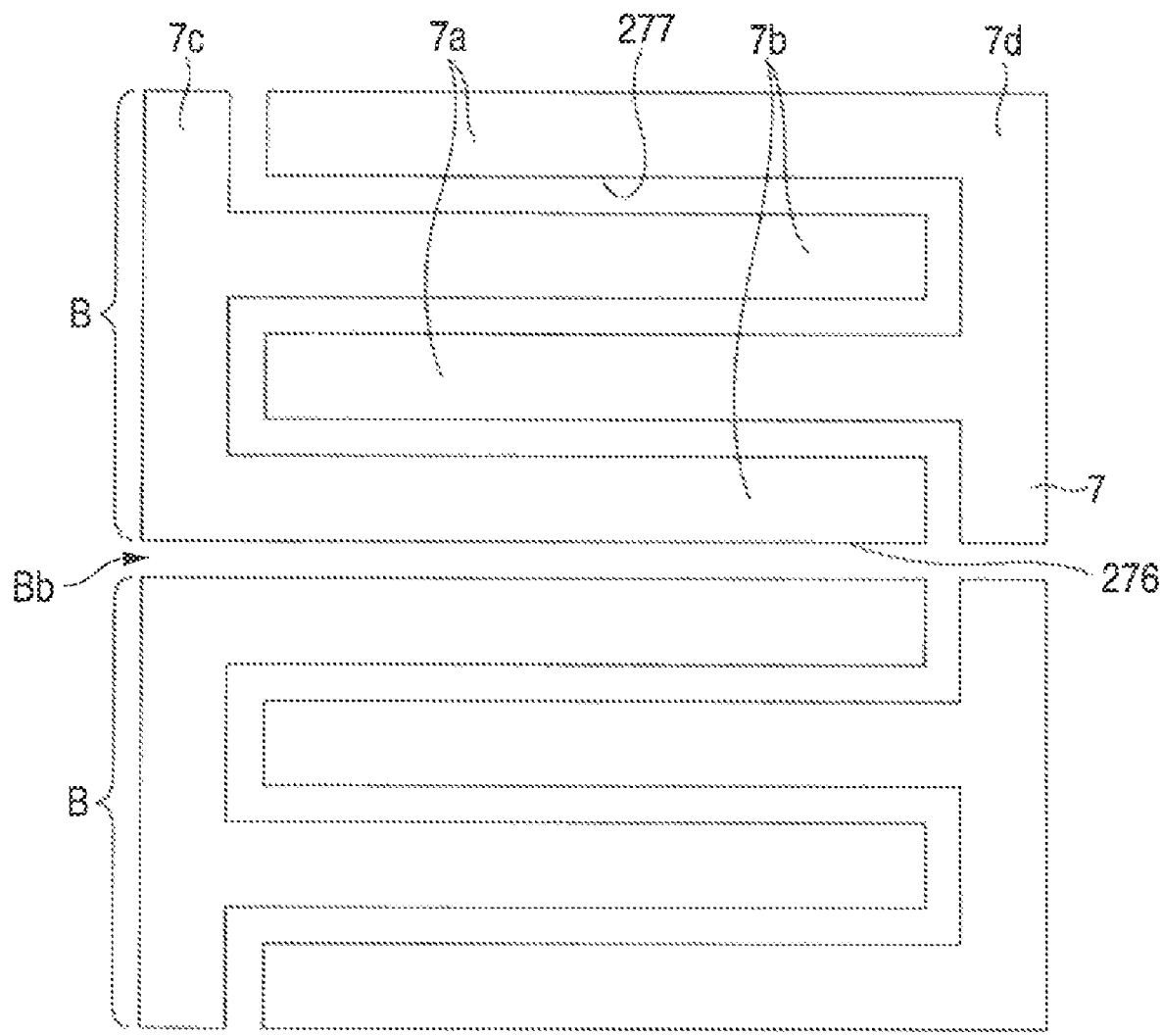
FIG. 32 shows still another example of the forming pattern of the slits.

FIG. 32 shows still another example of the forming pattern of the slits (grooves). In this pattern, word lines (WL) are divided into blocks B by a slit 276 formed on a boundary Bb of the blocks B. In each block B, a slit 277 is formed, and the word line (WL) 7 is separated by the slit 277 into linear portions 7a connected each other at one ends 7c and linear portions 7b connected each other at other ends 7d.

As shown in FIGS. 29 to 32, the slit (groove) of the word line (WL) may be formed in various shapes according to, for example, the arrangement of the block and the wiring connected to the peripheral circuits.

According to an aspect of the present invention, there is provided a nonvolatile semiconductor memory having three-dimensionally stacked memory cells with low-resistance word lines.

What is claimed is:

1. A nonvolatile semiconductor memory comprising:
   a semiconductor substrate;
   a plurality of columnar semiconductors formed on the semiconductor substrate to vertically extend in parallel with one another and to be in a matrix as viewed from above;
   plurality of charge storage insulating films formed around the columnar semiconductors, respectively:
   at least two of plate-like electrodes each extending two-dimensionally to be perpendicular to the columnar semiconductors and to surround the charge storage insulating films, each electrode respectively forming a memory transistor with the columnar semiconductors and the charge storage insulating films, at least one groove vertically passing through the electrodes to expose sidewalls of the electrodes; and
   a plurality of metal silicides formed on the exposed sidewalls of the electrodes, respectively.

2. The nonvolatile semiconductor memory according to claim 1, wherein the columnar semiconductor, the charge storage insulating film and the electrode form a memory transistor operated in a depression mode.

3. The nonvolatile semiconductor memory according to claim 1, wherein the columnar semiconductor comprises a plurality of columnar semiconductors;
   wherein the charge storage insulating film comprises a plurality of charge storage insulating films respectively formed around the plurality of columnar semiconductors;
   wherein the electrode is formed to surround the plurality of charge storage insulating films;
   wherein the groove comprises a plurality of grooves; and
   wherein the metal silicide is formed on respective sidewalls of the plurality of grooves.

4. The nonvolatile semiconductor memory according to claim 3, wherein the electrode comprises a plurality of linear portions separated from each other by the plurality of grooves.

5. The nonvolatile semiconductor memory according to claim 4, wherein the plurality of linear portions are connected with each other on one end of the electrode.

6. The nonvolatile semiconductor memory according to claim 4, wherein the plurality of linear portions are connected with each other on both ends of the electrode.

7. The nonvolatile semiconductor memory according to claim 3, wherein the plurality of columnar semiconductors are formed in parallel; and
   wherein the plurality of columnar semiconductors are disposed in a matrix.

8. The nonvolatile semiconductor memory according to claim 1, wherein the electrode comprises a plurality of electrodes alternately laminated with a plurality of insulators; and
   wherein each of the plurality of electrodes surrounds the charge storage insulating film.

9. The nonvolatile semiconductor memory according to claim 8, wherein the columnar semiconductor, the plurality of electrodes and the charge storage insulating film form a memory string having a plurality of memory transistors operated in a depression mode.

10. The nonvolatile semiconductor memory according to claim 1 further comprising:
    a gate insulating film formed around the columnar semiconductor above the charge storage insulating film;
    a second electrode surrounds the gate insulating film; and
    a second metal silicide formed on a sidewall of the second electrode.

11. The nonvolatile semiconductor memory according to claim 10, wherein the columnar semiconductor, the gate insulating film and the second electrode form a selection transistor operated in a depression mode.

12. The nonvolatile semiconductor memory according to claim 1, wherein the metal silicide comprises at least one of a titanium silicide, a cobalt silicide and a nickel silicide.

13. The nonvolatile semiconductor memory according to claim 1 further comprising:
    a plurality of gate insulating films formed around the columnar semiconductors above the charge storage insulating films, respectively;
    a gate electrode extending two-dimensionally to be perpendicular to the columnar semiconductors and to surround the gate insulating films, the gate electrode respectively forming a select transistor with the columnar semiconductors and the gate insulating films, at least one groove vertically passing through the gate electrode to expose a sidewall of the gate electrode; and
    a second metal silicide formed on the exposed sidewall of the gate electrode.

14. The nonvolatile semiconductor memory according to claim 13, wherein the second metal silicide comprises at least one of a titanium silicide, a cobalt silicide and a nickel silicide.

15. The nonvolatile semiconductor memory according to claim 13, wherein a plurality of grooves are formed in each electrode; and
    wherein a first metal silicide is formed on sidewalls of the plurality of grooves.

* * * * *